(12) United States Patent
Lee

(10) Patent No.: US 12,243,616 B2
(45) Date of Patent: Mar. 4, 2025

(54) MEMORY DEVICE FOR SUPPORTING STABLE DATA TRANSFER AND MEMORY SYSTEM INCLUDING THE SAME

(71) Applicant: SK hynix Inc., Icheon-si (KR)

(72) Inventor: Hyeon Uk Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 162 days.

(21) Appl. No.: 18/159,685

(22) Filed: Jan. 26, 2023

(65) Prior Publication Data

US 2024/0079037 A1    Mar. 7, 2024

(30) Foreign Application Priority Data

Sep. 2, 2022  (KR) .................. 10-2022-0111249

(51) Int. Cl.
*G11C 7/10*   (2006.01)
*G11C 29/52*  (2006.01)

(52) U.S. Cl.
CPC .......... *G11C 7/1057* (2013.01); *G11C 7/1045* (2013.01); *G11C 7/1084* (2013.01); *G11C 29/52* (2013.01)

(58) Field of Classification Search
CPC ..... G11C 29/52; G11C 7/1084; G11C 7/1045; G11C 7/1057
USPC .................................................. 365/189.05
See application file for complete search history.

(56) References Cited

U.S. PATENT DOCUMENTS

| | | | |
|---|---|---|---|
| 8,363,478 B1* | 1/2013 | Yang | G11C 16/28 365/185.24 |
| 9,183,125 B2 | 11/2015 | Brandl et al. | |
| 10,699,791 B2* | 6/2020 | Pletka | G06F 3/0604 |
| 2010/0002506 A1* | 1/2010 | Cho | G11C 11/5628 365/185.09 |
| 2010/0025811 A1* | 2/2010 | Bronner | H01L 21/67103 257/528 |
| 2010/0220536 A1* | 9/2010 | Coteus | G11C 8/12 365/194 |
| 2020/0408921 A1* | 12/2020 | Oh | G05D 1/0055 |
| 2021/0263577 A1* | 8/2021 | Zhang | G06F 1/28 |

FOREIGN PATENT DOCUMENTS

KR  10-2182718 B1  12/2019

* cited by examiner

Primary Examiner — Sung Il Cho

(57) ABSTRACT

A memory device may include: a memory region, an operation control unit configured to determine a toggling reference cycle and count for a first interval, configured to determine whether an error has occurred in a toggling input cycle and count of an external control signal, in order to control a data input/output operation for the memory region based on the toggling reference cycle and count for a second interval subsequent to the first interval, and configured to determine whether an input defense mode has been entered based on a result of the error determination, and an operation execution unit configured to perform a set operation in response to the external control signal for the second interval and configured to perform, when the input defense mode has been entered, a defense operation that is predefined in the input defense mode in response to an output signal of the operation control unit.

18 Claims, 10 Drawing Sheets

MEMORY DEVICE FOR SUPPORTING STABLE DATA TRANSFER AND MEMORY SYSTEM INCLUDING THE SAME

CROSS-REFERENCE TO RELATED APPLICATION

This application claims the benefit of priority under 35 U.S.C. § 119 to Korean Patent Application 10-2022-0111249 filed in the Korean Intellectual Property Office on Sep. 2, 2022, which is incorporated herein by reference in its entirety.

BACKGROUND

1. Field

Exemplary embodiments relate to a semiconductor memory device and, particularly, to a memory device for supporting stable data transfer and a memory system including the memory device.

2. Discussion of the Related Art

In modern memory systems, exemplary storage devices are semiconductors using advanced materials that include, for example silicon (Si), germanium (Ge), gallium arsenide (GaAs), indium phosphide (InP), or the like. The memory systems are classified into volatile memory devices and nonvolatile memory devices. A volatile memory device is a memory device in which data stored therein is lost when the power supply is interrupted.

A memory system includes a memory device and a memory controller for controlling an operation of the memory device. Furthermore, a data strobe signal DQS is used as a timing reference signal in order to transmit data at high speed between the memory device and the memory controller. However, when an error occurs, such as for example when some toggling of the data strobe signal is lost, stable data transfer may be difficult.

SUMMARY

An aspect of an embodiment in the present disclosure, a memory device may include: a memory region configured to store data; an operation control unit configured to determine a toggling reference cycle and a toggling reference count for a first interval, configured to determine whether an error has occurred in a toggling input cycle and input count of an external control signal that is applied from an outside, in order to control a data input/output operation for the memory region based on the toggling reference cycle and the toggling reference count for a second interval subsequent to the first interval, and configured to determine whether an input defense mode has been entered based on a result of the error determination; and an operation execution unit configured to perform a set operation in response to the external control signal for the second interval and configured to perform, when the input defense mode has been entered, a defense operation that is predefined in the input defense mode in response to an output signal of the operation control unit.

An aspect of an embodiment in the present disclosure, a memory system may include: a memory device configured to determine a toggling reference cycle and a toggling reference count for a first interval, configured to perform a set operation in response to a control signal that is applied from an outside for a second interval subsequent to the first interval, configured to determine, in an interval in which the set operation is performed, whether an error has occurred in a toggling input cycle and input count of the control signal based on the toggling reference cycle and the toggling reference count, and configured to determine whether to perform a defense operation after the execution of the set operation based on a result of the error determination; and a memory controller configured to generate the control signal that toggles by an operation count, which is determined based on the toggling reference count, in an operating cycle that is determined based on the toggling reference cycle, and configured to output the generated control signal to the memory device, in order to input/output data between the memory controller and the memory device for the second interval.

An aspect of an embodiment in the present disclosure, an operating method of a memory device, may include: a step of determining a toggling reference cycle and a toggling reference count for a first interval; a read operation step of outputting, to an outside, unit data that is read from a memory region by a number corresponding to a toggling input count of a read enable signal that is applied from the outside, by toggling a data strobe signal by the toggling input count for a second interval subsequent to the first interval; a read determination step of determining whether an error has occurred in the toggling input cycle and input count of the read enable signal based on the toggling reference cycle and the toggling reference count, in an interval in which the read operation step is performed; and a read defense step of outputting, to the outside, unit data that is read from the memory region by a number corresponding to a defense count, by additionally toggling the data strobe signal by the defense count after the interval in which the read operation step is performed if an error has occurred in the read enable signal.

An aspect of an embodiment in the present disclosure, an operating method of a memory device, may include: a step of determining a toggling reference cycle and a toggling reference count for a first interval; a write operation step of storing, in a buffer region, data that is input from an outside, in response to a toggling of a data strobe signal that is applied from the outside for a second interval subsequent to the first interval; a write determination step of determining whether an error has occurred in a toggling input cycle and input count of a write enable signal having the same toggling input cycle and input count as the data strobe signal and applied from the outside, based on the toggling reference cycle and the toggling reference count, in an interval in which the write operation step is performed; a step of discarding the data that is stored in the buffer region after the interval in which the write operation step is performed, if an error has occurred in the write enable signal, and then outputting a signal indicative of a write failure to the outside; and a step of storing, in a memory region, the data that is stored in the buffer region after the interval in which the write operation step is performed, if an error has not occurred in the write enable signal.

An aspect of an embodiment in the present disclosure, a memory device may include: a first storage region configured to store a determined toggling reference cycle and toggling reference count for a first interval; a second storage region configured to store data; a determination unit configured to determine whether an error has occurred in a toggling input cycle and input count of an external control signal that is applied from an outside in order to control a data input/output operation for the second storage region, based on the toggling reference cycle and the toggling reference count that are stored in the first storage region, for a second interval subsequent to the first interval; a defense mode control unit configured to enter an input defense mode in order to control a preset defense operation based on a type of external control signal, in response to a determination of the determination unit indicating that an error has occurred in the external control signal at least once; and an operation execution unit configured to perform a set operation in response to the external control signal for the second interval and configured to then perform the defense operation when an input defense mode is entered in response to an output signal of the defense mode control unit.

An aspect of an embodiment in the present disclosure, a memory device may include: a first storage region configured to store a determined toggling reference cycle and toggling reference count for a first interval; a second storage region configured to store data; a toggle generation unit configured to toggle a data strobe signal by an input count of a read enable signal that is applied from an outside for a second interval subsequent to the first interval and configured to then toggle a data strobe signal by a defense count when an input defense mode is entered; a buffer region configured to buffer, in the buffer region, unit data that is read from the second storage region for the second interval and configured to output, to the outside, the unit data that is buffered in the buffer region in response to the toggling of the data strobe signal; a determination unit configured to determine whether an error has occurred in a toggling input cycle and input count of the read enable signal, based on the toggling reference cycle and the toggling reference count that are stored in the first storage region for the second interval; a defense mode control unit configured to determine the defense count in response to a determination of the determination unit indicating that an error has occurred in the read enable signal at least once and configured to bring the toggle generation unit into the input defense mode.

DETAILED DESCRIPTION

Figure 1A:
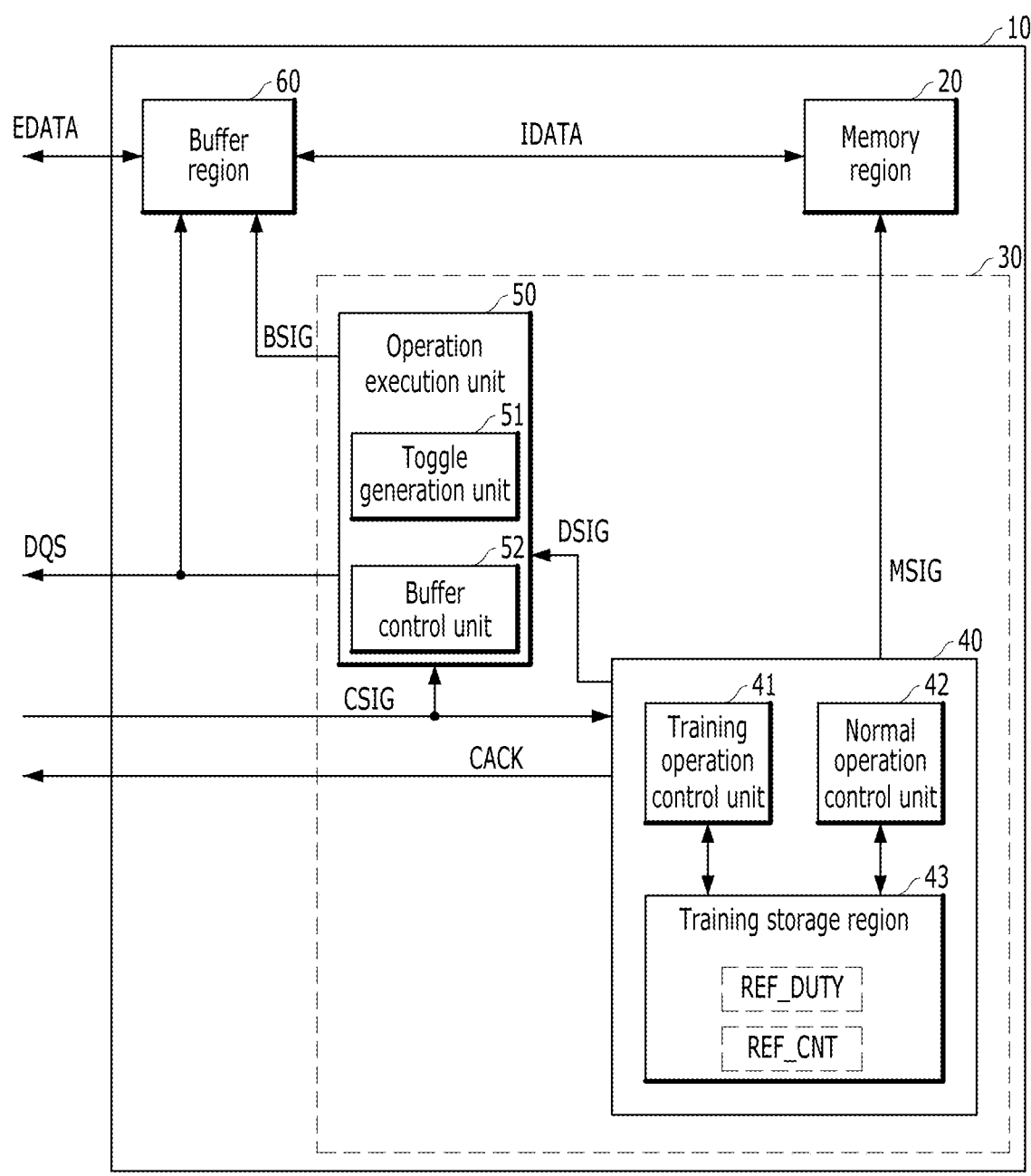
FIGS. 1A and 1B describe a memory device according to an embodiment of the present disclosure.

Various embodiments of the present disclosure are described below with reference to the accompanying drawings. Elements and features of the disclosure, however, may be configured or arranged differently to form other embodiments, which may be variations of any of the disclosed embodiments.

In this disclosure, references to various features (e.g., elements, structures, modules, components, steps, operations, characteristics, etc.) included in "one embodiment," "example embodiment," "an embodiment," "another embodiment," "some embodiments," "various embodiments," "other embodiments," "alternative embodiment," and the like are intended to mean that any such features are included in one or more embodiments of the present disclosure, but may or may not necessarily be combined in the same embodiments.

In this disclosure, the terms "comprise," "comprising," "include," and "including" are open-ended. As used in the appended claims, these terms specify the presence of the stated elements and do not preclude the presence or addition of one or more other elements. The terms in a claim do not foreclose the apparatus from including additional components (e.g., an interface unit, circuitry, etc.).

In this disclosure, various units, circuits, or other components may be described or claimed as "configured to" perform a task or tasks. In such contexts, "configured to" is used to connote structure by indicating that the blocks/units/circuits/components include structure (e.g., circuitry) that performs one or more tasks during operation. As such, the block/unit/circuit/component can be said to be configured to perform the task even when the specified block/unit/circuit/component is not currently operational (e.g., is not turned on nor activated). The block/unit/circuit/component used with the "configured to" language includes hardware—for example, circuits, memory storing program instructions executable to implement the operation, etc. Additionally, "configured to" can include a generic structure (e.g., generic circuitry) that is manipulated by software and/or firmware (e.g., an FPGA or a general-purpose processor executing software) to operate in a manner that is capable of performing the task(s) at issue. "Configured to" may also include adapting a manufacturing process (e.g., a semiconductor fabrication facility) to fabricate devices (e.g., integrated circuits) that implement or perform one or more tasks.

As used in the disclosure, the term 'circuitry' or 'logic' refers to all of the following: (a) hardware-only circuit implementations (such as implementations in only analog and/or digital circuitry) and (b) combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions and (c) circuits, such as a microprocessor(s) or a portion of a microprocessor(s), that require software or firmware for operation, even if the software or firmware is not physically present. This definition of 'circuitry' or 'logic' applies to all uses of this term in this application, including in any claims. As a further example, as used in this application, the term "circuitry" or "logic" also covers an implementation of merely a processor (or multiple processors) or a portion of a processor and its (or their) accompanying software and/or firmware. The term "circuitry" or "logic" also covers, for example, and if applicable to a particular claim element, an integrated circuit for a storage device.

As used herein, the terms "first," "second," "third," and so on are used as labels for nouns that the terms precede, and do not imply any type of ordering (e.g., spatial, temporal, logical, etc.). The terms "first" and "second" do not necessarily imply that the first value must be written before the second value. Further, although the terms may be used herein to identify various elements, these elements are not limited by these terms. These terms are used to distinguish one element from another element that otherwise have the same or similar names. For example, a first circuitry may be distinguished from a second circuitry.

Further, the term "based on" is used to describe one or more factors that affect a determination. This term does not foreclose additional factors that may affect a determination. That is, a determination may be solely based on those factors or based, at least in part, on those factors. For example, the phrase "determine A based on B." While in this case, B is a factor that affects the determination of A, such a phrase does not foreclose the determination of A from also being based on C. In other instances, A may be determined based solely on B.

Herein, an item of data, a data item, a data entry or an entry of data may be a sequence of bits. For example, the data item may include the contents of a file, a portion of the file, a page in memory, an object in an object-oriented program, a digital message, a digital scanned image, a part of a video or audio signal, metadata or any other entity which can be represented by a sequence of bits. According to an embodiment, the data item may include a discrete object. According to another embodiment, the data item may include a unit of information within a transmission packet between two different components.

Various embodiments are directed to a memory device for supporting a stable data transfer by checking, in the memory device, whether an error of a control signal for the transfer of data that is input from the outside has occurred, and a memory system including the same.

Technical objects to be achieved by the present disclosure are not limited to the aforementioned object, and the other objects not described above may be evidently understood from the following description by a person having ordinary knowledge in the art to which the present disclosure pertains.

This technology may perform a defensive operation for confirming, in a memory device, whether an error of a control signal for the transfer of data occurs when the control signal is input to the memory device, and for minimizing damage attributable to the occurrence of the error based on a result of the confirmation. Accordingly, the memory device can stably transmit data.

Figure 1B:
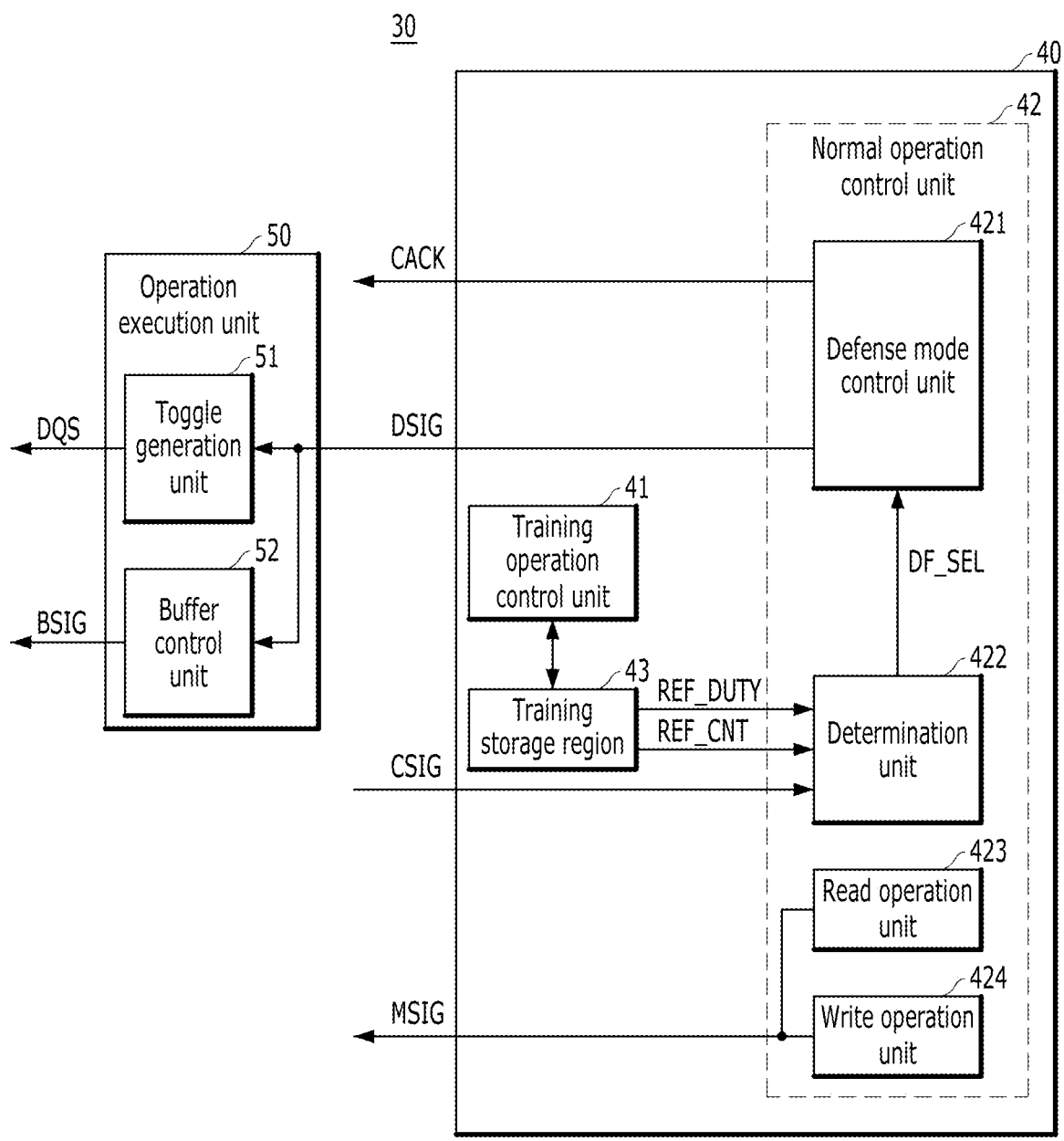

FIGS. 1A and 1B describe a memory device according to an embodiment of the present disclosure.

Referring to FIG. 1A, a memory device 10 according to an embodiment of the present disclosure may include a memory region 20, a control region 30, and a buffer region 60. The control region 30 may include an operation control unit 40 and an operation execution unit 50. The operation control unit 40 may include a training operation control unit 41, a normal operation control unit 42, and a training storage region 43. The operation execution unit 50 may include a toggle generation unit 51 and a buffer control unit 52.

Referring to FIG. 1B, the normal operation control unit 42 that is included in the operation control unit 40 may include a defense mode control unit 421, a determination unit 422, a read operation unit 423, and a write operation unit 424.

Referring to both FIGS. 1A and 1B, the memory device 10 may store, in the memory device 10, data that is provided from the outside through a write operation, and may provide the outside with data that is stored in the memory device through a read operation.

In an embodiment, the memory device 10 may take many alternative forms, such as a double data rate synchronous dynamic random access memory (DDR SDRAM), a low power double data rate fourth generation (LPDDR4) SDRAM, a graphics double data rate (GDDR) SDRAM, a low power DDR (LPDDR) SDRAM, a Rambus dynamic random access memory (RDRAM), a NAND flash memory, a vertical NAND flash memory, a NOR flash memory device, a resistive RAM (RRAM), a phase-change memory (PRAM), a magnetoresistive RAM (MRAM), a ferroelectric RAM (FRAM), or a spin transfer torque RAM (STT-RAM). In the present specification, for convenience of description, a description will be made on the assumption that the memory device 10 is a NAND flash memory.

The memory device 10 may receive a command and an address from the outside, and may access the area of the memory cell array, selected by the address. That is, the memory device 10 may perform an operation indicated by the command on the area selected by the address. For example, the memory device 10 may perform a write operation (i.e., program operation), a read operation, and an erase operation. During a program operation, the memory device 10 may program data to the area selected by the address. During a read operation, the memory device 10 may read data from the area selected by the address. During an erase operation, the memory device 10 may erase data stored in the area selected by the address.

Specifically, the control region 30 that is included in the memory device 10 may be a component for controlling an overall operation of the memory device 10. For example, the control region 30 may store, in the memory region 20, write data that is applied from the outside via the buffer region 60 in response to a write command and an address that are applied from the outside. Furthermore, the control region 30 may read data that is stored in the memory region 20 in response to a read command and an address that are applied from the outside, and may output the data to the outside via the buffer region 60.

Furthermore, the memory region 20 that is included in the memory device 10 is a region for storing data. The memory region 20 may receive data that is input through the buffer region 60 from the outside of the memory device 10 when a program operation is performed in response to an output signal MSIG of the control region 30, and may store the data in the memory region 20. The memory region 20 may read data that is stored in the memory region 20 when a read operation is performed in response to the output signal MSIG of the control region 30, and may output read data IDATA to the outside of the memory device 10 through the buffer region 60. The memory region 20 may include multiple memory cells each capable of storing data. The memory cells may be configured as single level cells (SLCs) each storing 1-bit data, multi-level cells (MLCs) each storing 2-bit data, triple level cells (TLCs) each storing 3-bit data or quad level cells (QLCs) each storing 4-bit data.

The memory region 20 may include a plurality of memory blocks. Each memory block may include a plurality of memory cells. One memory block may include a plurality of pages. In an embodiment, each page may be a unit by which data is stored in the memory device 10 or by which data stored in the memory device 10 is read. A memory block may be a unit by which data is erased.

Furthermore, the buffer region 60 that is included in the memory device 10 may buffer the data EDATA and IDATA that are input/output between the outside of the memory device 10 and the memory region 20.

Referring to FIG. 1B, the memory device 10 according to an embodiment of the present disclosure may determine a toggling reference cycle REF_DUTY and a toggling reference count REF_CNT for a first interval. Furthermore, the memory device 10 may perform a "set operation" in response to an external control signal CSIG that is applied from the outside, for a second interval subsequent to the first interval. Furthermore, the memory device 10 may determine whether an error occurs in a toggling input cycle and input count of the external control signal CSIG based on the toggling reference cycle REF_DUTY and the toggling reference count REF_CNT in an interval in which the "set operation" is executed, and may determine whether to perform a "defense operation" after the execution of the "set operation" based on a result of the determination. That is, when confirming that an error has occurred in the external control signal CSIG in the interval in which the "set operation" is executed, the memory device 10 may additionally perform the "defense operation" after the execution of the "set operation" is completed. In contrast, when confirming that an error has not occurred in the external control signal CSIG in the interval in which the "set operation" is executed, the memory device 10 does not perform the "defense operation" after the execution of the "set operation" is completed.

For reference, the toggling "input cycle" of the external control signal CSIG may mean an interval between a specific edge of the external control signal CSIG that is input from the outside and another specific edge. If a specific edge means a rising edge, then the toggling "input cycle" of the external control signal CSIG may mean an interval from a precedent rising edge of the external control signal CSIG to a subsequent rising edge of the external control signal CSIG, e.g., an interval from a first rising edge to a second rising edge after the toggling of the external control signal CSIG is started. If a specific edge means a falling edge, then the toggling "input cycle" of the external control signal CSIG may mean an interval from a precedent falling edge of the external control signal CSIG to a subsequent falling edge of the external control signal CSIG, e.g., an interval from a second falling edge to a third falling edge after the toggling of the external control signal CSIG is started.

Furthermore, the toggling "input count" of the external control signal CSIG may mean the number of times that a specific edge of the external control signal CSIG that is input from the outside is repeated. If a specific edge means a rising edge, then the toggling "input count" of the external control signal CSIG may mean the number of times that a rising edge of the external control signal CSIG is repeated from toggling start timing of the external control signal CSIG that toggles in order to input/output data having a specific size to toggling completion timing of the external control signal CSIG. If a specific edge means a falling edge, then the toggling "input count" of the external control signal CSIG may mean the number of times that a falling edge of the external control signal CSIG is repeated from toggling start timing of the external control signal CSIG that toggles in order to input/output data having a specific size to toggling completion timing of the external control signal CSIG.

For example, the operation control unit 40 that is included in the control region 30 of the memory device 10 may determine the toggling reference cycle REF_DUTY and the toggling reference count REF_CNT for a first interval. In this case, the first interval may mean any one of the interval in which the memory device 10 is supplied with power and booted and the interval in which the memory device 10 performs an initialization operation in response to an initialization signal that is applied from the outside to the memory device 10. That is, the operation control unit 40 may determine the toggling reference cycle REF_DUTY and the toggling reference count REF_CNT by performing a training operation in any one of the booting interval and the initialization interval.

The operation control unit 40 may store, in the training storage region 43 within the operation control unit 40, the toggling reference cycle REF_DUTY and the toggling reference count REF_CNT, which are determined in a first interval.

After a first interval, the operation control unit 40 may determine whether, in a second interval, an error has occurred in the toggling input cycle and input count of the external control signal CSIG based on the toggling reference cycle REF_DUTY and the toggling reference count REF_CNT that are stored in the training storage region 43 within the operation control unit 40. The operation control unit 40 may determine whether to enter an input defense mode based on a result of the determination. Here, the second interval may mean an interval in which a normal operation, for example, an operation such as read/write is performed after a booting interval or an initialization interval. That is, the operation control unit 40 may determine whether an error has occurred in the toggling input cycle and input count of the external control signal CSIG, which is applied from the outside, in order to perform an operation, such as read/write, in a normal operation interval. Furthermore, the operation control unit 40 may determine whether to enter the input defense mode based on a result of the determination.

If, in at least one instance, a toggling input cycle of the external control signal CSIG that is input from the outside is different from the toggling reference cycle REF_DUTY that is stored in the training storage region 43 within the operation control unit 40, then the operation control unit 40 may determine that an error has occurred in the external control signal CSIG. Among the components of the normal operation control unit 42, the determination unit 422, which is in turn included in the operation control unit 40, may determine whether an error has occurred in the toggling input cycle and input count of the external control signal CSIG based on the toggling reference cycle REF_DUTY and the toggling reference count REF_CNT that are stored in the training storage region 43. If a toggling input count of the external control signal CSIG that is input from the outside is not a multiple of the toggling reference count REF_CNT that is stored in the training storage region 43, then the determination unit 422 may determine that an error has occurred in the external control signal CSIG. The determination unit 422 may determine that an error has occurred in the external control signal CSIG under either of the following: when a toggling input cycle of the external control signal CSIG is different from the toggling reference cycle REF_DUTY that is stored in the training storage region 43 at least once, or when a toggling input count of the external control signal CSIG is not a multiple of the toggling reference count REF_CNT that is stored in the training storage region 43, which is found within the operation control unit 40.

Furthermore, the operation execution unit 50 that is included in the control region 30 of the memory device 10 may perform a "set operation" in response to the external control signal CSIG. After performing the "set operation", the operation execution unit 50 may enter the input defense mode in response to an output signal DSIG of the operation control unit 40. When entering the input defense mode, the operation execution unit 50 may perform a "defense operation" that has been previously defined in the input defense mode. Among the components of the normal operation control unit 42, the defense mode control unit 421 may enter the input defense mode in order to control a preset "defense operation" depending on the type of external control signal CSIG, in response to a determination of the determination unit 422 indicating that an error has occurred in the external control signal CSIG at least once. The defense mode control unit 421 may enter the input defense mode, in order to control a preset "defense operation" depending on the type of external control signal CSIG, in response to an output signal DF_SEL of the determination unit 422. The defense mode control unit 421 may enter the input defense mode, may generate the output signal DSIG for controlling the "defense operation", and may output the generated output signal DSIG to the operation execution unit 50. That is, after performing a "set operation" in response to the external control signal CSIG for a second interval, when the operation execution unit 50 enters the input defense mode in response to the output signal DSIG of the defense mode control unit 421, the operation execution unit 50 may perform the "defense operation." The operation execution unit 50 may differently set the type of "defense operation" that is performed in the input defense mode, depending on the type of external control signal CSIG.

The external control signal CSIG may be a signal that is applied from the outside in order to input/output data of the memory region 20. In different embodiments, the external control signal CSIG may be a read enable signal for controlling an operation of the read data IDATA, which has been read from the memory region 20, being output to the outside of the memory device 10 after the start of a read operation. In different embodiments, the external control signal CSIG may be a write enable signal for controlling an operation of the write data EDATA being input from the outside of the memory device 10 to the inside of the memory device 10 after the start of a write operation.

More specifically, after the start of a read operation in which the external control signal CSIG is a read enable signal, the operation control unit 40 may read the data IDATA from the memory region 20 and store the read data IDATA in the buffer region 60 before the operation execution unit 50 performs a "set operation." Among the components of the normal operation control unit 42, the read operation unit 423 may read data of the memory region 20 in response to a read command that is input earlier than a read enable signal and store the read data in the buffer region 60, after the start of a read operation.

The operation execution unit 50 may perform an operation of generating a data strobe signal DQS as a "set operation" in response to a read enable signal. That is, the operation execution unit 50 may perform, as the "set operation", an operation of generating the data strobe signal DQS that toggles by a toggling input count of the read enable signal. The toggle generation unit 51 that is included in the operation execution unit 50 may perform, as the "set operation", the operation of generating the data strobe signal DQS that toggles by the toggling input count of the read enable signal.

Through the "set operation" of the operation execution unit 50, under the control of the operation control unit 40, "unit data" of a number corresponding to a toggling count of the data strobe signal DQS, among data that are stored in the buffer region 60, may be output to the outside of the memory device 10.

While the operation execution unit 50 performs a "set operation", the operation control unit 40 may determine whether an error has occurred in the toggling input cycle and input count of a read enable signal based on the toggling reference cycle REF_DUTY and the toggling reference count REF_CNT that are stored in the training storage region 43, which is within the operation control unit 40. The determination unit 422 may determine whether an error has occurred in the toggling input cycle and input count of a read enable signal based on the toggling reference cycle REF_DUTY and the toggling reference count REF_CNT, which are stored in the training storage region 43. That is, while the operation execution unit 50 performs the "set operation", the determination unit 422 may determine that an error has occurred in the read enable signal either when the toggling input count of the read enable signal that is input from the outside is not a multiple of the toggling reference count, or when the toggling input cycle of the read enable signal that is input from the outside is different from the toggling reference cycle at least once.

In such a case, the operation control unit 40 may bring the operation execution unit 50 into the input defense mode so that the operation execution unit 50 additionally performs a "defense operation" after the operation execution unit 50 completes the execution of a "set operation." The defense mode control unit 421 may enter the input defense mode in order to control a "defense operation" corresponding to a read enable signal, in response to a determination of the determination unit 422 indicating that an error has occurred in the read enable signal at least once. The defense mode control unit 421 may enter the input defense mode in order to control the "defense operation" corresponding to the read enable signal, in response to the output signal DF_SEL of the determination unit 422.

After the start of a read operation, a "defense operation" that is defined in the input defense mode may be an operation of toggling the data strobe signal DQS by a defense count. That is, the operation execution unit 50 may perform the operation of toggling the data strobe signal DQS by the defense count as the "defense operation" corresponding to a read enable signal in the interval in which the input defense mode is entered. The toggle generation unit 51 that is included in the operation execution unit 50 may perform, as the "defense operation", the operation of toggling the data strobe signal DQS by the defense count in the interval in which the input defense mode is entered. The toggle generation unit 51 may enter the input defense mode in response to the output signal DSIG of the defense mode control unit 421, and may perform, as the "defense operation", the operation of toggling the data strobe signal DQS by the defense count. After completing the execution of the "defense operation" in response to the output signal DSIG of the defense mode control unit 421, the toggle generation unit 51 may exit from the input defense mode.

When bringing the operation execution unit 50 into the input defense mode in a read operation, the operation control unit 40 may determine a value of a defense count of a read enable signal so that the sum of the toggling input count and defense count of the read enable signal becomes a multiple of the toggling reference count REF_CNT that is stored in the training storage region 43. The operation control unit 40 may generate the output signal DSIG for toggling the data strobe signal DQS by the determined defense count, and may output the generated output signal DSIG to the toggle generation unit 51. The determination unit 422 may determine a value of the defense count that is necessary for the toggling input count of the read enable signal to become a multiple of the toggling reference count REF_CNT that is stored in the training storage region 43. The determination unit 422 may also generate the output signal DF_SEL for transferring the determined value of the defense count, and may output the generated output signal DF_SEL to the defense mode control unit 421. The defense mode control unit 421 may generate the output signal DSIG for controlling the toggle generation unit 51, that is, for toggling the data strobe signal DQS by the defense count based on the defense count that has been determined by the determination unit 422, and may output the generated output signal DSIG to the toggle generation unit 51.

The operation execution unit 50 may toggle the data strobe signal DQS in the same frequency as a toggling frequency of a read enable signal that is input from the outside while performing a "set operation." The toggle generation unit 51 that is included in the operation execution unit 50 may toggle the data strobe signal DQS in the same frequency as a toggling frequency of a read enable signal that is input from the outside while a "set operation" is performed. The operation execution unit 50 may set the frequency of the data strobe signal DQS that is toggled while a "defense operation" is performed to be smaller than or equal to the frequency of the data strobe signal DQS that is toggled while a "set operation" is performed. The toggle generation unit 51 that is included in the operation execution unit 50 may set the frequency of the data strobe signal DQS that is toggled while a "defense operation" is performed to be smaller than or equal to the frequency of the data strobe signal DQS that is toggled while a "set operation" is performed.

The operation control unit 40 may determine that an error has not occurred in a read enable signal that is input from the outside while the operation execution unit 50 performs a "set operation" for a second interval. The determination unit 422 may determine that an error has not occurred in a read enable signal that is input from the outside while the operation execution unit 50 performs a "set operation" for a second interval. That is, while the operation execution unit 50 performs the "set operation" for the second interval, if a toggling input count of the read enable signal that is input from the outside is a multiple of a toggling reference count and simultaneously each of all toggling input cycles corresponding to the toggling input count is the same as a toggling reference cycle, then the determination unit 422 may determine that an error has not occurred in the read enable signal. In such a case, the operation control unit 40 may not bring the operation execution unit 50 into the input defense mode, so the operation execution unit 50 does not additionally perform a "defense operation" after completing the execution of the "set operation." That is, the defense mode control unit 421 may not enter the input defense mode in response to the output signal DF_SEL of the determination unit 422, and may generate the output signal DSIG and output the generated output signal DSIG to the operation execution unit 50 so that the operation execution unit 50 does not enter the input defense mode.

More specifically, after the start of a write operation in which the external control signal CSIG is a write enable signal, the operation execution unit 50 may perform, as a "set operation", an operation of storing the write data EDATA in the buffer region 60 in response to the data strobe signal DQS that is input from the outside of the memory device 10 along with a write enable signal. That is, the buffer region 60 may store the data EDATA that is input from the outside in the buffer region 60, in response to a signal BSIG that is output by the operation execution unit 50 and the data strobe signal DQS that is input from the outside. At this time, the operation execution unit 50 may perform, as a "set operation", an operation of storing, in the buffer region 60, "unit data" of a number corresponding to a toggling count of the data strobe signal DQS among the write data EDATA that is input from the outside of the memory device 10. The toggling count of the data strobe signal DQS that is input from the outside may be the same as the toggling input count of the write enable signal that is input from the outside.

While the operation execution unit 50 performs a "set operation", the operation control unit 40 may determine whether an error has occurred in the toggling input cycle and input count of a write enable signal based on the toggling reference cycle REF_DUTY and the toggling reference count REF_CNT that are stored in the training storage region 43 within the operation control unit 40. The determination unit 422 may determine whether an error has occurred in the toggling input cycle and input count of a write enable signal based on the toggling reference cycle REF_DUTY and the toggling reference count REF_CNT that are stored in the training storage region 43. While the operation execution unit 50 performs the "set operation", the determination unit 422 may determine that an error has occurred in the write enable signal either when the toggling input count of the write enable signal that is input from the outside is not a multiple of the toggling reference count or when the toggling input cycle of the write enable signal that is input from the outside is different from the toggling reference cycle at least once.

In such a case, the operation control unit 40 may bring the operation execution unit 50 into the input defense mode so that the operation execution unit 50 additionally performs a "defense operation" after completing the execution of a "set operation." The defense mode control unit 421 may enter the input defense mode in order to control a "defense operation" corresponding to a write enable signal, in response to a determination of the determination unit 422 indicating that an error has occurred in the write enable signal at least once. The defense mode control unit 421 may enter the input defense mode in order to control the "defense operation" corresponding to the write enable signal, in response to the output signal DF_SEL of the determination unit 422.

After the start of a write operation, a "defense operation" that is defined in the input defense mode may be an operation of discarding data that is stored in the buffer region 60. That is, the operation execution unit 50 may perform, as a "defense operation", an operation of discarding data that is stored in the buffer region 60 in the interval in which the input defense mode is entered. The buffer control unit 52 that is included in the operation execution unit 50 may perform, as a "defense operation", an operation of discarding data that is stored in the buffer region 60 in the interval in which the input defense mode is entered. The buffer control unit 52 may enter the input defense mode in response to the output signal DSIG of the defense mode control unit 421, and may perform, as a "defense operation", an operation of discarding data that is stored in the buffer region 60. At this time, the buffer region 60 may discard the data that is stored in the buffer region in response to the signal BSIG that is output by the buffer control unit 52. The buffer control unit 52 may exit from the input defense mode after completing the execution of the "defense operation", in response to the output signal DSIG of the defense mode control unit 421.

If the operation control unit 40 brings the operation execution unit 50 into the input defense mode in a write operation, then the operation control unit 40 may output a signal CACK indicative of a write failure to the outside of the memory device 10. If the defense mode control unit 421 brings the buffer control unit 52 into the input defense mode in a write operation, then the defense mode control unit 421 may output the signal CACK indicative of a write failure to the outside of the memory device 10.

If the operation control unit 40 does not bring the operation execution unit 50 into the input defense mode after the execution of a "set operation" in a write operation, then the operation control unit 40 may program, into the memory region 20, data that is stored in the buffer region 60. The determination unit 422 may determine that an error has not occurred in a write enable signal that is input from the outside while the operation execution unit 50 performs a "set operation" for a second interval. That is, while the operation execution unit 50 performs the "set operation" for the second interval, if a toggling input count of the write enable signal that is input from the outside is a multiple of a toggling reference count and simultaneously each of all toggling input cycles corresponding to the toggling input count is the same as a toggling reference cycle, the operation control unit 40 may determine that an error has not occurred in the write enable signal. In such a case, the operation control unit 40 may program, into the memory region 20, data that is stored in the buffer region 60 after the operation execution unit 50 completes the execution of the "set operation." That is, the write operation unit 424, from among the components of the normal operation control unit 42, may program, into the memory region 20, the data that is stored in the buffer region 60. The write operation unit 424 may operate in response to a write command that is input earlier than the write enable signal, but may program, into the memory region 20, the data that is stored in the buffer region 60 after waiting until the data for write is stored in the buffer region 60. If data that is stored in the buffer region 60 is discarded through a "defense operation" of the operation execution unit 50, then data to be written is not present in the buffer region 60. Accordingly, the write operation unit 424 may not perform a program operation.

For reference, in general, the read enable signal or the write enable signal that is described as an embodiment of the external control signal CSIG may mean a signal for controlling an operation of a command and an address being input from the outside of the memory device 10 and an operation of data being input to/output from the memory device 10. However, the data strobe signal DQS may be used as a signal for controlling an operation of data being input/output depending on the type of memory device 10, instead of directly using the external control signal CSIG. In such a case, the data strobe signal DQS may be generated based on the external control signal CSIG. For example, a toggling operation of the data strobe signal DQS may be set in a form that is associated with a toggling operation of the external control signal CSIG.

The aforementioned embodiment illustrates that the data strobe signal DQS instead of directly using the read enable signal or the write enable signal, that is, the external control signal CSIG, is used to control a data input/output operation. Furthermore, the aforementioned embodiment illustrates that if the data strobe signal DQS is generated based on the external control signal CSIG in order to control a data input/output operation, then the toggling cycle and toggling count of the external control signal CSIG are set to always have the same values as the toggling cycle and toggling count of the data strobe signal DQS.

For reference, data that has a specific size and that is input to/output from the memory device 10 in response to the data strobe signal DQS being toggled once may be defined as "unit data." For example, if data having a 1-byte size is input to/output from the memory device 10 in response to the data strobe signal DQS being toggled once, then "unit data" may mean data having a 1-byte size.

Furthermore, the training operation control unit 41 that is included in the operation control unit 40 may perform a training operation on the memory device 10 for a first interval, and may determine a value of the toggling reference cycle REF_DUTY as the results of the execution of the training operation. The training operation control unit 41 may store, in the training storage region 43, the toggling reference cycle REF_DUTY that is determined by performing the training operation.

The training operation may be a duty cycle correction (DCC) training operation, a read training operation, or a write training operation. The training operation may be an operation of optimizing the phase, amplitude, etc. of a signal that is input to/output from the memory device 10. Particularly, the training operation control unit 41 may determine a value of the toggling reference cycle REF_DUTY through a DCC training operation.

Furthermore, the training operation control unit 41 may store, in the training storage region 43, a value of the toggling reference count REF_CNT that is input from the outside of the memory device 10 for a first interval.

Figure 2A:
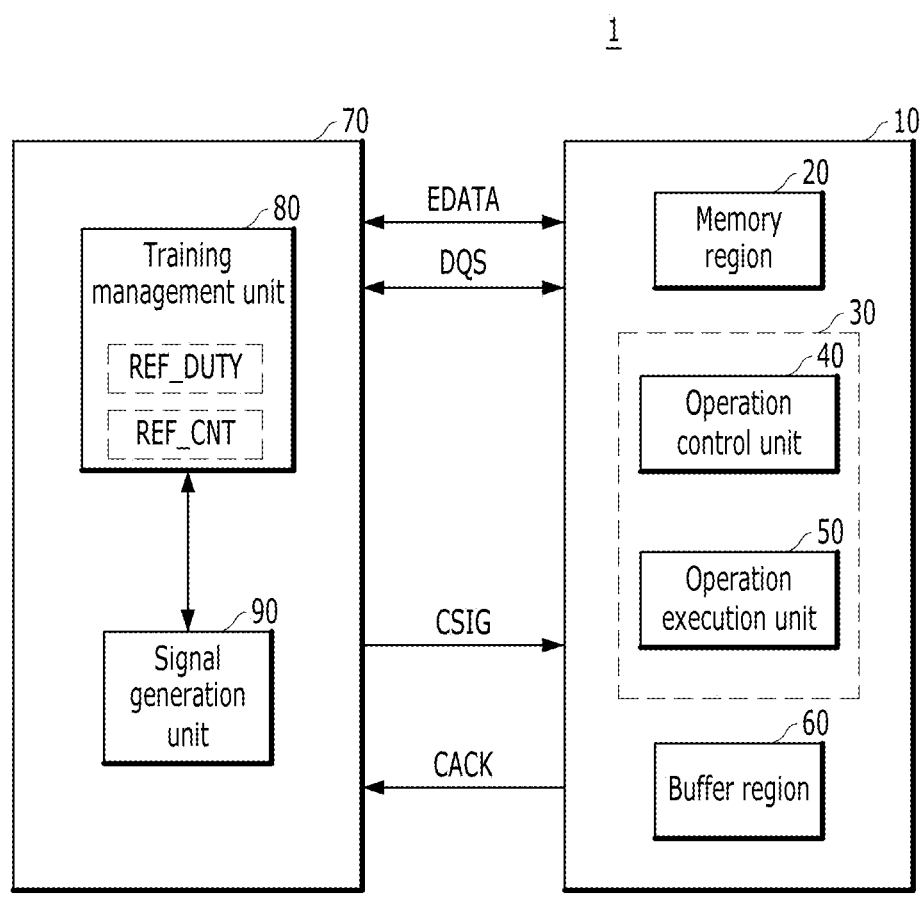
FIG. 2A describes an example of a memory system including a memory device according to an embodiment of the present disclosure.

FIG. 2A describes an example of a memory system including a memory device according to an embodiment of the present disclosure.

Referring to FIG. 2A, a memory system 1 may include a memory device 10 and a memory controller 70.

The memory device 10 that is included in the memory system 1 of FIG. 2A may mean the memory device 10 described with reference to FIG. 1A. Accordingly, in FIGS. 1A and 2A, the same reference numeral "10" is used for the memory device. Components 20, 30, 40, 50, and 60 that are included in the memory device 10 in FIGS. 1A and 1B and the components 20, 30, 40, 50, and 60 that are included in the memory device 10 in FIG. 2A are completely identical with each other. Accordingly, redundant description with reference to FIGS. 1A and 1B will not be included in the description of FIG. 2A. In FIG. 2A, the memory system 1 may include the memory device 10 and the memory controller 70. The memory device 10 and the memory controller 70 within the memory system 1 may be components that are physically divided. The memory device 10 and the memory controller 70 may be connected by at least one data path. For example, the data path may include a channel and/or a way.

In different embodiments, the memory device 10 and the memory controller 70 may be components that are functionally divided. Furthermore, in different embodiments, the memory device 10 and the memory controller 70 may be implemented through one semiconductor device chip or a plurality of semiconductor device chips. In different embodiments, and potentially in the case of memory system 1, a high degree of integration is required, and so the memory device 10 and the memory controller 70 may be configured as one semiconductor device chip.

The memory device 10 may store data. The memory device 10 operates in response to control of the memory controller 70.

The memory device 10 may receive a command and an address from the memory controller 70. The memory device 10 is configured to access a region that belongs to a memory region 20 and that is selected by a received address. To access the selected region may mean that an operation corresponding to a received command is performed on the selected region. For example, the memory device 10 may perform a write operation (program operation), a read operation, and an erase operation. After the start of a program operation, the memory device 10 will program data into a region that is selected by an address. After the start of a read operation, the memory device 10 will read data from a region that is selected by an address. After the start of an erase operation, the memory device 10 will erase data that is stored in a region that is selected by an address.

When power is applied to the memory system 1, the memory controller 70 may run firmware (FW). When the memory device 10 is a flash memory device, the memory controller 70 may run firmware such as a flash translation layer (FTL) for controlling communication between the host and the memory device 10.

The memory controller 70 may receive data and a logical block address (LBA) from the host, and may translate the logical block address into a physical block address (PBA) indicating the address of memory cells that are included in the memory device 10 and in which data is to be stored.

The memory controller 70 may control the memory device 10 so that a program operation, a read operation, or an erase operation is performed in response to a request received from the host. During a program operation, the memory controller 70 may provide a program command, a physical block address, and data to the memory device 10.

During a read operation, the memory controller 70 may provide a read command and a physical block address to the memory device 10. During an erase operation, the memory controller 70 may provide an erase command and a physical block address to the memory device 10.

The memory controller 70 may autonomously generate a command, an address, and data regardless of a request from the host, and may transmit the command, the address, and the data to the memory device 10. For example, the memory controller 70 may provide commands, addresses, and data to the memory device 10 to support background operations, such as a program operation for wear leveling and a program operation for garbage collection.

The memory controller 70 according to an embodiment of the present disclosure may determine a value of the toggling reference cycle REF_DUTY by performing a training operation along with the memory device for a first interval. The memory controller 70 may perform the training operation for the first interval in order to transmit and receive data to and from the memory device 10 normally, regardless of variations in process, voltage, and temperature. The training operation may be an operation of optimizing the phases, amplitude, etc. of signals that are exchanged between the memory device 10 and the memory controller 70 in order for the memory device 10 and the memory controller 70 to exchange accurate data. In this case, the first interval may mean any one of the interval in which the memory controller 70 and the memory device 10 are supplied with power and booted and the interval in which the memory device 10 performs an initialization operation in response to an initialization signal that is applied from the memory controller 70 to the memory device 10.

Furthermore, the memory controller 70 may output a value of a preset toggling reference count REF_CNT to the memory device 10 depending on an operating environment of the memory system 1. The toggling reference count REF_CNT may mean a minimum toggling count of a signal that is transferred between the memory controller 70 and the memory device 10. For example, when mutually transmitting signals, the memory controller 70 and the memory device 10 may toggle at least eight times. Accordingly, the toggling reference count REF_CNT may be "8." In this case, the memory controller 70 may include a table in which multiple toggling count values which may be selected as the toggling reference count REF_CNT are stored. The memory controller 70 may select any one value of the multiple toggling count values as the toggling reference count REF_CNT depending on an operating environment of the memory system 1. Furthermore, the operating environment of the memory system 1 may mean the type of memory device 10 that is included in the memory system 1, a connection interface method between the memory controller 70 and the memory device 10 that are included in the memory system 1, etc.

The memory device 10 may store, in the training storage region 43, a value of the toggling reference cycle REF_DUTY that is determined by performing a training operation under the control of the memory controller 70 for a first interval. Furthermore, the memory device 10 may store, in the training storage region 43, a value of the toggling reference count REF_CNT that is input by the memory controller 70 for the first interval.

The memory controller 70 may generate the control signal CSIG that toggles by an operation count that is determined based on the toggling reference count REF_CNT in an operating cycle that is determined based on the toggling reference cycle REF_DUTY, in order to input/output data to/from the memory device 10 for a second interval subsequent to the first interval, and may output the generated control signal CSIG to the memory device 10. That is, the control signal CSIG that is transferred from the memory controller 70 to the memory device 10 may be set to be toggled in the toggling reference cycle REF_DUTY. Furthermore, the control signal CSIG that is transferred from the memory controller 70 to the memory device 10 may be set to toggle by a number corresponding to a multiple of the toggling reference count REF_CNT. In this case, the second interval may mean an interval in which the memory device 10 performs a normal operation after a booting interval or an initialization interval, for example, an operation, such as read/write, in response to a request from the memory controller 70.

The memory device 10 may perform a "set operation" in response to the control signal CSIG that is applied by the memory controller 70 for the second interval subsequent to the first interval. Furthermore, the memory device 10 may determine whether an error has occurred in the toggling input cycle and input count of the control signal CSIG, based on the toggling reference cycle REF_DUTY and the toggling reference count REF_CNT in the interval in which the "set operation" is executed, and may determine whether to perform a "defense operation" after the execution of the "set operation" based on a result of the determination. That is, some of the control signal CSIG may be lost due to an unpredictable error while the control signal CSIG is transferred from the memory controller 70 to the memory device 10. The memory device 10 may determine whether an error has occurred in the toggling input cycle and input count of the control signal CSIG that is input by the memory controller 70, based on the toggling reference cycle REF_DUTY and the toggling reference count REF_CNT that have been determined in the first interval. If it is confirmed that an error has occurred in the control signal CSIG in the interval in which the "set operation" is executed, then the memory device 10 may additionally perform the "defense operation" after the execution of the "set operation" is completed. In contrast, if it is confirmed that an error has not occurred in the control signal CSIG in the interval in which the "set operation" is executed, then the memory device 10 does not perform the "defense operation" after the execution of the "set operation" is completed.

After the start of a read operation in the second interval, the memory controller 70 may generate a read enable signal as the control signal CSIG, and may output the generated read enable signal to the memory device 10. The read enable signal may toggle in the toggling reference cycle REF_DUTY, and may toggle by a number corresponding to a multiple of the toggling reference count REF_CNT. The memory device 10 may perform, as a "set operation", an operation of generating the data strobe signal DQS in response to the read enable signal. If it is determined that an error has occurred in the read enable signal in the interval in which the "set operation" is executed, then the memory device 10 may additionally toggle the data strobe signal DQS through a "defense operation" after the interval in which the "set operation" is executed. The memory device 10 may store, in the buffer region 60, data that is read from the memory region 20, and may then output, to the memory controller 70, the data EDATA that is stored in the buffer region 60 by synchronizing the data EDATA with a rising edge or falling edge of the data strobe signal DQS.

After the start of a write operation in the second interval, the memory controller 70 may generate a write enable signal as the control signal CSIG, and may output the generated write enable signal to the memory device 10. The write enable signal may toggle in the toggling reference cycle REF_DUTY, and may toggle by a number corresponding to a multiple of the toggling reference count REF_CNT. Furthermore, the memory controller 70 may output, to the memory device 10, write data that is input by a host or that is generated within the memory controller 70. The memory controller 70 may generate the data strobe signal DQS and output the generated data strobe signal DQS to the memory device 10. At this time, the memory controller 70 may determine the toggling cycle and toggling count of the data strobe signal DQS based on a toggling count and toggling cycle of the write enable signal. The memory controller 70 may transmit, to the memory device 10, by synchronizing the write data with a rising edge or falling edge of the data strobe signal DQS. The memory device 10 may perform, as a "set operation", an operation of storing the write data EDATA that is applied by the memory controller 70 in the buffer region 60 in response to the toggling of the data strobe signal DQS. If it is determined that an error has not occurred in the write enable signal in the interval in which the "set operation" is executed, then the memory device 10 may program, into the memory region 20, the data that is stored in the buffer region 60. If it is determined that an error has occurred in the write enable signal in the interval in which the "set operation" is executed, then the memory device 10 may discard the data that is stored in the buffer region 60, and may output, to the memory controller 70, the signal CACK indicative of a write failure. A more detailed operation of the memory device 10, which is performed in the second interval, has been described with reference to FIGS. 1A and 1B, and will be no longer described herein.

More specifically, the memory controller 70 may include a training management unit 80 and a signal generation unit 90.

The training management unit 80 may generate training data for a first interval, and may perform a training operation by using the generated training data. For example, the training management unit 80 may perform a DCC training operation, a read training operation, or a write training operation along with the memory device 10. Particularly, the training management unit 80 may determine a value of the toggling reference cycle REF_DUTY by performing a DCC training operation along with the memory device 10.

The training management unit 80 may determine a value of the toggling reference count REF_CNT for a first interval, and may transmit the determined toggling reference count REF_CNT to the memory device 10.

In order to input/output data to/from the memory device 10 for a second interval after a first interval, the signal generation unit 90 may generate the control signal CSIG that toggles, by an operation count that is determined based on the toggling reference count REF_CNT in an operating cycle that is determined based on the toggling reference cycle REF_DUTY, and may output the generated control signal CSIG to the memory device 10. That is, the control signal CSIG that is transferred from the memory controller 70 to the memory device 10 may be set to toggle in the toggling reference cycle REF_DUTY. Furthermore, the control signal CSIG that is transferred from the memory controller 70 to the memory device 10 may be set to toggle by a number corresponding to a multiple of the toggling reference count REF_CNT.

The memory system 1 may communicate with the host using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

Figure 2B:
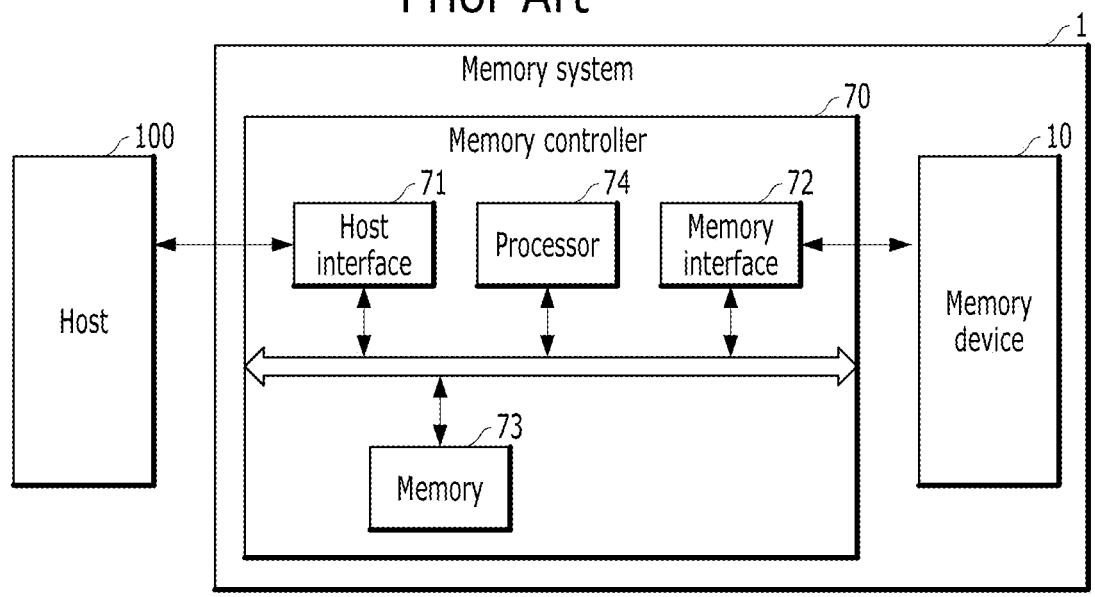
FIG. 2B describes an example of a data processing device including a memory device according to an embodiment of the present disclosure.

FIG. 2B describes an example of a data processing device including a memory device according to an embodiment of the present disclosure.

Referring to FIG. 2B, the data processing system may include a host 100 and a memory system 1.

In the data processing system of FIG. 2B, the memory system 1 that includes a memory controller 70 and a memory device 10 is the same as the memory system 1 and the memory controller 70 and the memory device 10 that are included in the memory system 1 previously described with reference to FIG. 2A. Accordingly, in FIGS. 2A and 2B, the same reference numeral "1" is used for the memory systems, the same reference numeral "70" is used for the memory controllers, and the same reference numeral "10" is used for the memory devices.

However, in FIG. 2A, the components that are included in the memory controller 70 are divided from a viewpoint of a functional operation, whereas in FIG. 2B, the components that are included in the memory controller 70 are divided from a viewpoint of a physical device. Accordingly, the description of FIG. 2B will disclose how a functional operation of the memory controller 70 disclosed in FIG. 2A may be implemented from a viewpoint of the physical device along with the description of the physical device, and will not describe elements and features that are redundant with those of FIG. 2A.

Specifically, the host 100 and the memory system 70 that are included in the data processing system may be connected through data transfer means, such as a data bus or a host cable, and may transmit and receive data.

The host 100 that operates in conjunction with the memory system 1, or the data processing system that includes the memory system 1, may include mobile electronic devices such as for example, automotive electronic devices and portable and non-portable electronic devices. Examples of a portable and non-portable electronic devices include a mobile phone, an MP3 player, a laptop computer, as a desktop computer, a game console, TV, and a projector. The host 100 may provide a mutual operation between the host 100 and a user who uses the data processing system or the memory system 1 through at least one operating system (OS). For example, the host 100 may transmit, to the memory system 1, a plurality of commands corresponding to a user request, and the memory system 1 may perform operations corresponding to the plurality of commands (i.e., operations corresponding to a user request).

The memory system 1 may be implemented as any one of a solid state driver (SSD), a multimedia card (e.g., an MMC, an embedded MMC (eMMC), a reduced size MMC (RS-MMC) and a micro-MMC), a secure digital card (e.g., an SD, a mini-SD and a micro-SD), a universal serial bus (USB) storage device, a universal flash storage (UFS) device, a compact flash (CF) card, a smart media card, and a memory stick.

In different embodiments, the memory controller 70 may include a host interface 71, a processor 74, a memory interface 72, and memory 73. The components that are included in the memory controller 70 described with reference to FIG. 2B may be different depending on an implementation form, operation performance, etc. of the memory system 1. The components that are included in the memory controller 70 may be added or removed depending on an implementation form of the memory system 1.

The host 100 and the memory system 1 may include a controller or an interface for transmitting and receiving a signal, data, etc. in accordance with an agreed rule. For example, the host interface 71 within the memory system 1 may include a device capable of transmitting a signal or data to the host 100 or capable of receiving a signal or data that is transferred by the host 100. According to an embodiment, the host interface 71 is a type of layer for exchanging data with the host 100 and is implemented with, or driven by, firmware called a host interface layer (HIL). The host 100 and the memory system 1 may use a predetermined set of rules or procedures for data communication, or a preset interface to transmit and receive data therebetween.

Examples of communication standards or interfaces used to transmit/receive data may include various form factors such as 2.5-inch form factor, 1.8-inch form factor, MO-297, MO-300, M.2, and EDSFF (Enterprise and Data Center SSD Form Factor) and various communication standards or interfaces such as USB (Universal Serial Bus), MMC (MultiMedia Card), PATA (Parallel Advanced Technology Attachment), SCSI (Small Computer System Interface), ESDI (Enhanced Small Disk Interface), IDE (Integrated Drive Electronics), PCIe (Peripheral Component Interconnect Express), SAS (Serial-attached SCSI), SATA (Serial Advanced Technology Attachment), and MIPI (Mobile Industry Processor Interface). According to an embodiment, the host 100 and the memory system 1 may be connected through a universal serial bus (USB). The Universal Serial Bus (USB) is a type of scalable, hot-pluggable plug-and-play serial interface that can provide cost-effective standard connectivity between the host 100 and peripheral devices such as a keyboard, a mouse, a joystick, a printer, a scanner, a storage device, a modem, a video camera, and the like.

The Non-volatile memory express (NVMe) is a type of interface based at least on a Peripheral Component Interconnect Express (PCIe) designed to increase performance and design flexibility of the host 100, servers, computing devices, and the like equipped with the non-volatile memory system 1. The PCIe can use a slot or a specific cable for connecting a computing device (e.g., host 100) and a peripheral device (e.g., memory system 1). For example, the PCIe can use a plurality of pins (e.g., 18 pins, 32 pins, 49 pins, or 82 pins) and at least one wire (e.g., ×1, ×4, ×8, or ×16) to achieve high speed data communication over several hundred MB per second (e.g., 250 MB/s, 500 MB/s, 984.6250 MB/s, or 1969 MB/s). According to an embodiment, the PCIe scheme may achieve bandwidths of tens to hundreds of Giga bits per second. The NVMe can support an operation speed of the non-volatile memory system 1, such as an SSD, that is faster than a hard disk.

The memory interface 72 may transmit and receive signals or data between the memory controller 70 and the memory device 10 in order for the memory controller 70 to control the memory device 10 in response to a request from the host 100. If the memory device 10 is a flash memory (e.g., a NAND flash memory), then the memory interface 72 may include a NAND flash controller (NFC). In different embodiments, the memory interface 72 supports a data input/output between the memory controller 70 and the memory device 10. The memory interface 72 is a region in which data is exchanged with the memory device 10, and may be implemented or driven through firmware that is called a flash interface layer (hereinafter referred to as an "FIL"). In different embodiments, the memory interface 72 may support an open NAND flash interface (ONFi) or a toggle mode for a data input/output between the memory controller 70 and the memory device 10. For example, ONFi may use a data path (e.g., a channel or a way) that includes a signal line capable of supporting bidirectional transmission and reception for 8-bit or 16-bit unit data. Data communication between the memory controller 70 and the memory device 10 may be performed through a device that supports an interface for at least one of an asynchronous single data rate (SDR), a synchronous double data rate (DDR), and a toggle DDR.

The memory 73 is a working memory of the memory system 1 and the memory controller 70, and may store data that is necessary for the driving of the memory system 1 and the memory controller 70 or data that is generated during the driving, or may store information with regard to an operation that is performed by the memory controller 70. In different embodiments, the memory 73 may be implemented as volatile memory, and may be implemented as static random access memory (SRAM) or dynamic random access memory (DRAM), for example. In different embodiments, the memory 73 may be present inside the memory controller 70 or may be present outside the memory controller 70. In an example, the memory 73 may be implemented as external volatile memory to/from which data is input/output by the memory controller 70 through a memory interface.

The processor 74 may control an operation of the memory controller 70. In response to a write request or a read request from the host 100, the processor 74 may perform a program operation or a read operation on the memory device 10. In order to control a data input/output operation of the memory controller 70, the processor 74 may drive firmware that is called a host interface layer (HIL), a flash translation layer (hereinafter referred to as an "FTL"), or an FIL. In different embodiments, the processor 74 may be implemented as a microprocessor or a central processing unit (CPU). Furthermore, in different embodiments, the processor 74 may be implemented as a multi-core processor, that is, a circuit in which two or more cores with different operation processing regions are integrated.

An operation of the training management unit 80 and the signal generation unit 90, among the components of the memory controller 70 disclosed in FIG. 2A, may be implemented through an operation of the processor 74, the memory interface 72, and the memory 73 disclosed in FIG. 2B. For example, a training operation that is performed in the training management unit 80 may be implemented through the processor 74 and the memory interface 72. Furthermore, the toggling reference cycle REF_DUTY and the toggling reference count REF_CNT that are generated as the results of the training operation may be stored in the memory 73.

Figure 3A:
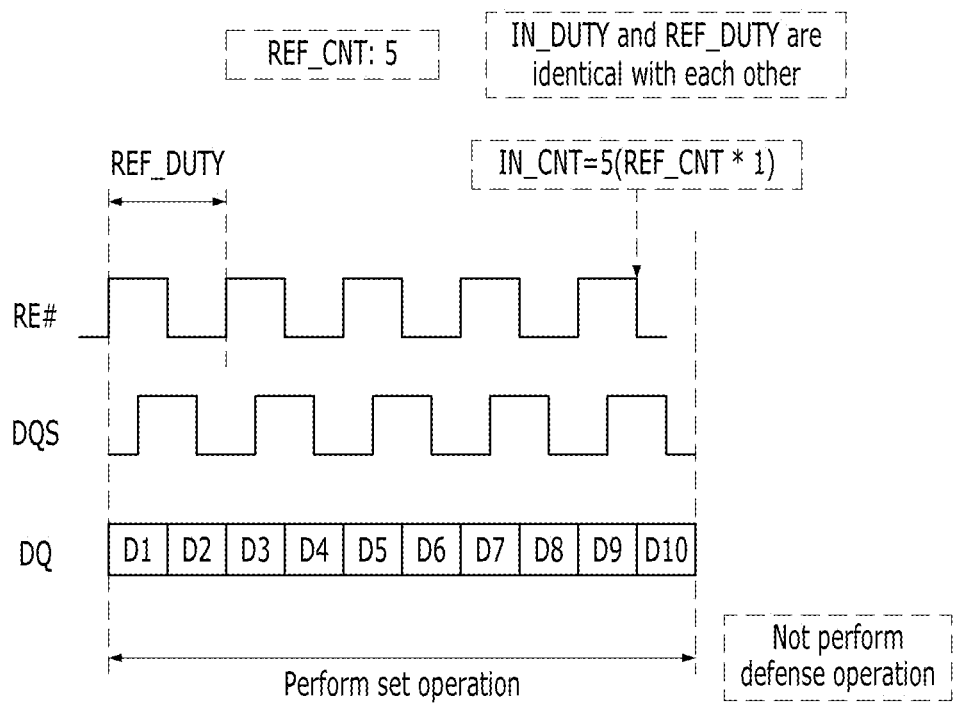
FIGS. 3A and 3B describe examples of data read operations in a memory device according to embodiments of the present disclosure.
Figure 3B:
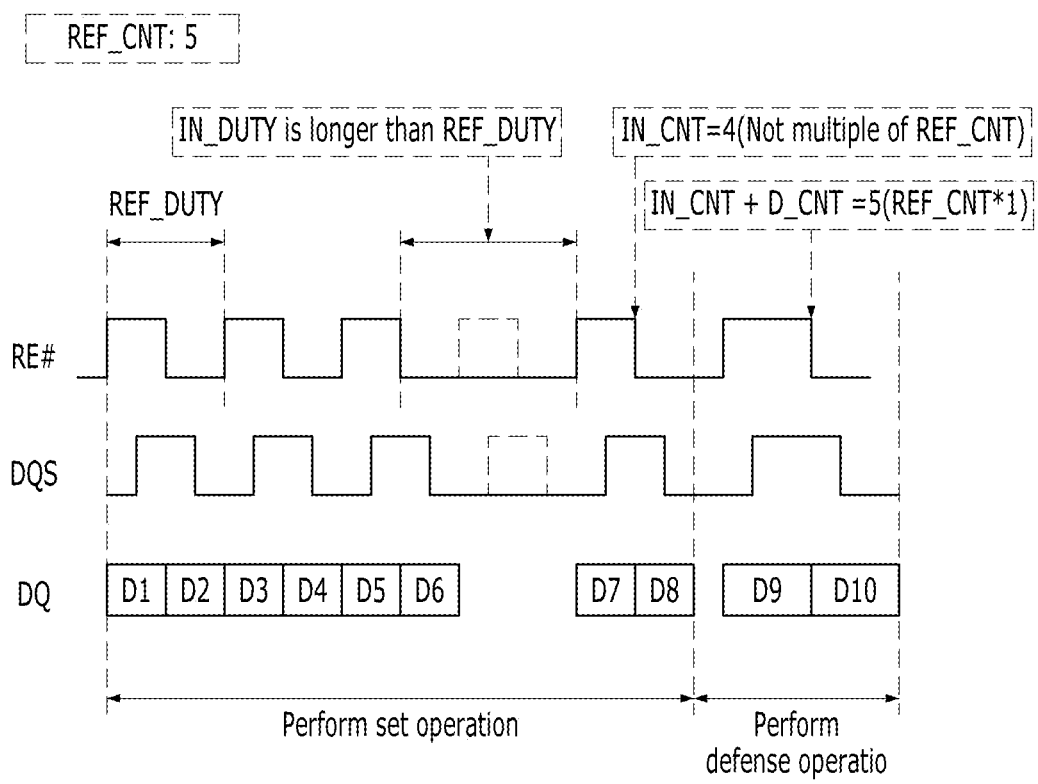

FIGS. 3A and 3B describe examples of data read operations in a memory device according to embodiments of the present disclosure.

In an embodiment, FIG. 3A illustrates a read operation in which a memory device 10 performs only a "set operation" and does not perform a "defense operation".

Specifically, a read enable signal RE # may be input to the memory device 10 while toggling in the toggling reference cycle REF_DUTY. The toggling count of the read enable signal RE # may be set as a multiple of the toggling reference count REF_CNT.

FIG. 3A illustrates a toggling reference count REF_CNT that has been set as 5. Accordingly, the memory device 10 may determine that an error has occurred in the read enable signal RE # when the toggling input count IN_CNT of the read enable signal RE #(i.e., the toggling reference count REF_CNT) is not a multiple of 5, or when the toggling input cycle IN_DUTY of the read enable signal RE # is different from the toggling reference cycle REF_DUTY at least once.

This drawing may illustrate that the toggling input count IN_CNT of the read enable signal RE # is 5 and is one multiple of the toggling reference count REF_CNT. Furthermore, this drawing may illustrate that each of all of the toggling input cycles IN_DUTY of the read enable signal RE # is identical with the toggling reference cycle REF_DUTY. Accordingly, the memory device 10 may determine that an error has not occurred in the read enable signal RE #, and as a result no "defense operation" is performed after performing a "set operation."

The memory device 10 may perform, as the "set operation", an operation of toggling the data strobe signal DQS by the toggling input count IN_CNT of the read enable signal RE #. In FIG. 3A, the toggling input count IN_CNT of the read enable signal RE # is 5. Accordingly, the memory device 10 may perform, as the "set operation", an operation of toggling the data strobe signal DQS five times in total. After storing, in the buffer region 60, multiple "unit data" that are read from the memory region 20, the memory device 10 may output a total of ten "unit data" D<1:10> from the buffer region 60 by operating in a way to output two "unit data" from the buffer region 60 in response to the data strobe signal DQS being toggled once, that is, in a way to output one "unit datum" from the buffer region 60 at each of a rising edge and falling edge of the data strobe signal DQS.

In an embodiment, FIG. 3B illustrates a read operation in which the memory device 10 performs a "set operation" and then performs a "defense operation".

Specifically, a read enable signal RE # may be input to the memory device 10 while toggling in the toggling reference cycle REF_DUTY. The toggling count of the read enable signal RE # may be set as a multiple of the toggling reference count REF_CNT.

In FIG. 3B, the toggling reference count REF_CNT has been determined as 5. Accordingly, either when the toggling input count IN_CNT of the read enable signal RE # is not a multiple of 5, that is, the toggling reference count REF_CNT, or when the toggling input cycle IN_DUTY of the read enable signal RE # is different from the toggling reference cycle REF_DUTY at least once, the memory device 10 may determine that an error has occurred in the read enable signal RE #.

In FIG. 3B, the toggling input count IN_CNT of the read enable signal RE # is 4 and is not a multiple of the toggling reference count REF_CNT. Furthermore, some of the toggling input cycle IN_DUTY of the read enable signal RE # is longer than the toggling reference cycle REF_DUTY. Accordingly, the memory device 10 may determine that an error has occurred in the read enable signal RE #, and may perform a "defense operation" after performing a "set operation." For reference, a part that belongs to the read enable signal RE # and that has been illustrated as being toggled by a dotted line may mean the state in which the part has been lost without being toggled.

The memory device 10 may check that the toggling input count IN_CNT of the read enable signal RE # is 4 in the "set operation" interval, and may determine a defense count D_CNT as one so that a total count of the toggling input count IN_CNT of the read enable signal RE # and the defense count D_CNT becomes a multiple of 5, that is, the toggling reference count REF_CNT. That is, the memory device 10 may internally perform an operation of further toggling the read enable signal RE # once although the read enable signal RE # applied by the memory controller 70 has not been toggled in the "defense operation" that is performed after the execution of the "set operation" is completed.

The memory device 10 may perform, as the "set operation", an operation of toggling the data strobe signal DQS by the toggling input count IN_CNT of the read enable signal RE #. Furthermore, after the execution of the "set operation" is completed, the memory device 10 may perform, as the "defense operation", an operation of additionally toggling the data strobe signal DQS by the defense count D_CNT by additionally toggling the read enable signal RE # by the defense count D_CNT. In FIG. 3B, the toggling input count IN_CNT of the read enable signal RE # is 4 and the defense count D_CNT is 1. Accordingly, after performing an operation of toggling the data strobe signal DQS four times as the "set operation", the memory device 10 may perform, as the "defense operation", an operation of toggling the data strobe signal DQS once.

After storing, in the buffer region 60, multiple "unit data" that are read from the memory region 20, the memory device 10 may output a total of ten "unit data" D<1:10> from the buffer region 60 by operating in a way to output two "unit data" from the buffer region 60 in response to the data strobe signal DQS being toggled once, that is, in a way to output one "unit datum" from the buffer region 60 at each of a rising edge and falling edge of the data strobe signal DQS. As described above, if an error has occurred in the read enable signal RE # in the interval in which a "set operation" is executed, then the memory device 10 may perform a "defense operation" so that "unit data" of a number that has been presented as a target of a read operation is output by the memory device 10 without being lost.

Figure 4A:
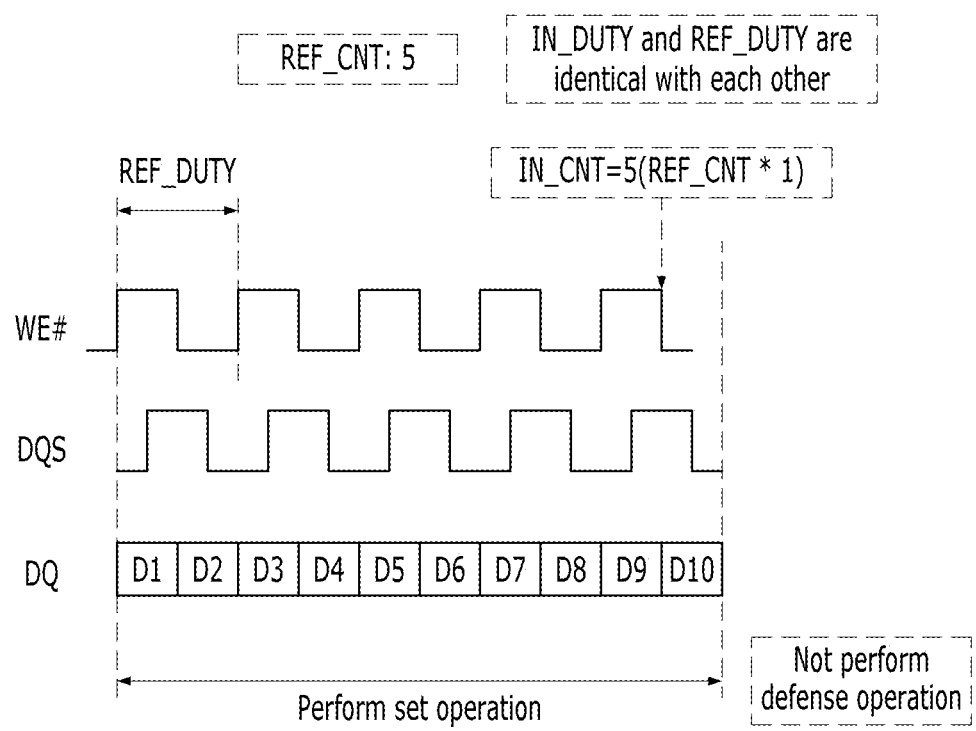
FIGS. 4A and 4B describe examples of data write operations in a memory device according to an embodiment of the present disclosure.
Figure 4A:
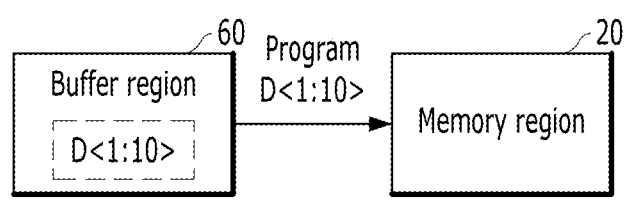
Figure 4B:
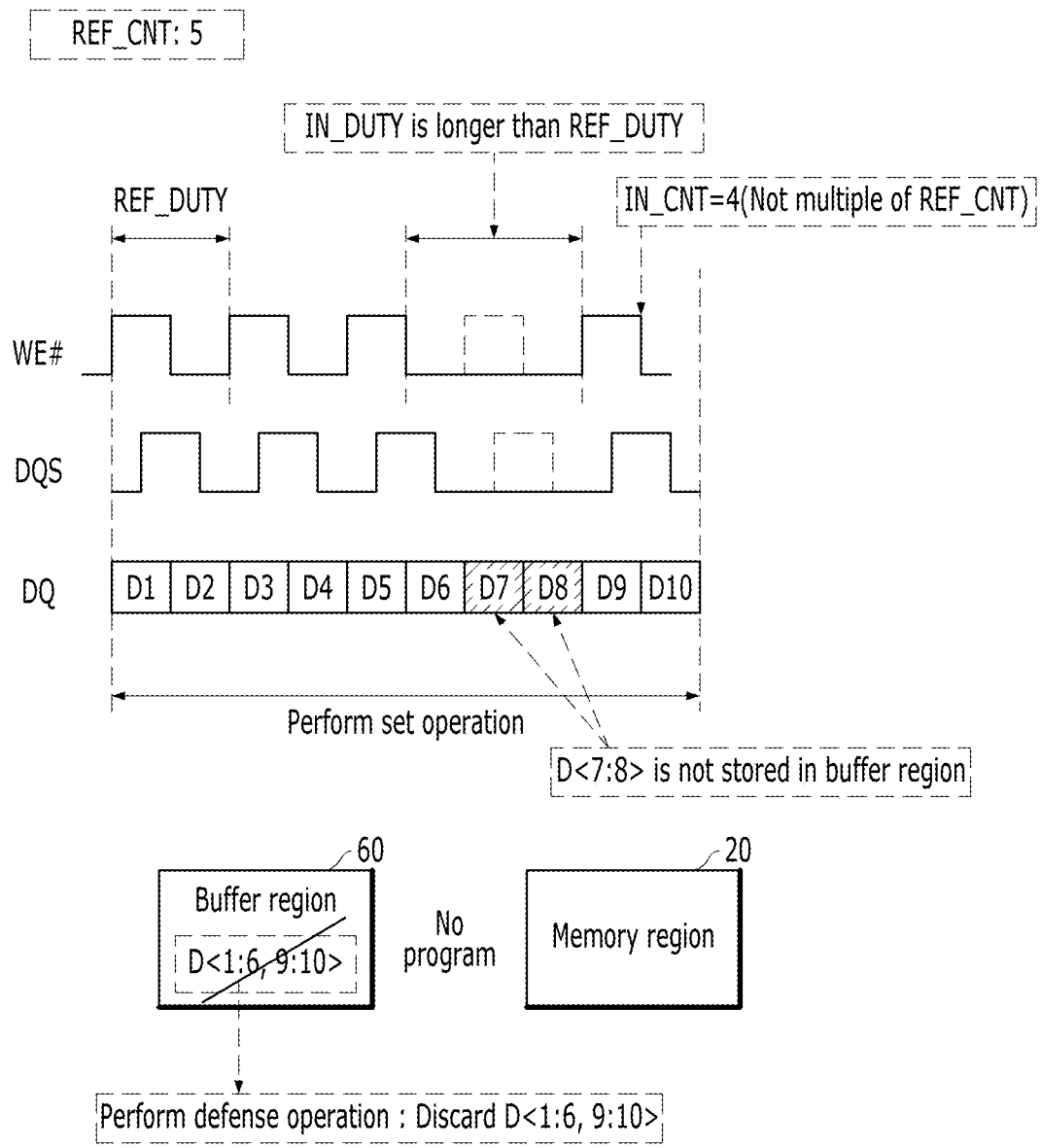

FIGS. 4A and 4B describe examples of data write operations in a memory device according to an embodiment of the present disclosure.

In an embodiment illustrated by FIG. 4A, a write operation is performed in which the memory device 10 performs only a "set operation" and does not perform a "defense operation".

Specifically, a write enable signal WE # may be input to the memory device 10 while toggling in the toggling reference cycle REF_DUTY. The toggling count of the write enable signal WE # may be set as a multiple of the toggling reference count REF_CNT. Furthermore, the data strobe signal DQS that is generated based on the toggling cycle and toggling count of the write enable signal WE # may be input to the memory device 10. Accordingly, the toggling count of the data strobe signal DQS may be set as a multiple of the toggling reference count REF_CNT. That is, when generated by the memory controller 70, the write enable signal WE # and the data strobe signal DQS may be input to the memory device 10 in a state in which the toggling input cycle IN_DUTY and toggling input count IN_CNT of each of the write enable signal WE # and the data strobe signal DQS have already been determined. Furthermore, the number of "unit data" that is included in write data that is input to the memory device 10 in synchronization with the data strobe signal DQS may have already been determined.

In FIG. 4A, the toggling reference count REF_CNT has been determined as 5. Accordingly, the memory device 10 may determine that an error has occurred in the write enable signal WE # either when the toggling input count IN_CNT of the write enable signal WE # is not a multiple of 5, that is, the toggling reference count REF_CNT, or when the toggling input cycle IN_DUTY of the write enable signal WE # is different from the toggling reference cycle REF_DUTY at least once.

FIG. 4A illustrates that the toggling input count IN_CNT of the write enable signal WE # is 5 and is one multiple of the toggling reference count REF_CNT. Furthermore, each of all of the toggling input cycles IN_DUTY of the write enable signal WE # is identical with the toggling reference cycle REF_DUTY. Accordingly, the memory device 10 may determine that an error has not occurred in the write enable signal WE #, and does not perform a "defense operation" after performing a "set operation."

The memory device 10 may perform, as the "set operation", an operation of storing write data in the buffer region 60 in response to the data strobe signal DQS that is input along with the write enable signal WE # and that toggles by the toggling input count IN_CNT of the write enable signal WE #.

FIG. 4A illustrates that the toggling input count IN_CNT of the write enable signal WE # is 5. Furthermore, the toggling count of the data strobe signal DQS is also 5. Furthermore, a total of ten "unit data" are input to the memory device 10 as write data in a way that two "unit data" are input to the memory device 10, that is, in a way that one "unit datum" is input to the memory device 10 at each of a rising edge and falling edge of the data strobe signal DQS, in response to the data strobe signal DQS being toggled once. Accordingly, the memory device 10 may perform, as a "set operation", an operation of storing the total of ten "unit data" in the buffer region 60 in response to the data strobe signal DQS being toggled five times in total.

Referring to FIG. 4B, in an embodiment, the memory device 10 performs a "defense operation" after performing a "set operation" when performing a write operation.

Specifically, a write enable signal WE # may be input to the memory device 10 while toggling in the toggling reference cycle REF_DUTY. The toggling count of the write enable signal WE # may be set as a multiple of the toggling reference count REF_CNT. Furthermore, the data strobe signal DQS that is generated based on the toggling cycle and toggling count of the write enable signal WE # may be input to the memory device 10. Accordingly, the toggling count of the data strobe signal DQS may be set as a multiple of the toggling reference count REF_CNT. That is, when generated by the memory controller 70, the write enable signal WE # and the data strobe signal DQS may be input to the memory device 10 in a state in which each of the toggling input cycle IN_DUTY and toggling input count IN_CNT of the write enable signal WE # and the data strobe signal DQS have already been determined. Furthermore, the number of "unit data" that is included in write data that is input to the memory device 10 in synchronization with the data strobe signal DQS may have already been determined.

In FIG. 4B, the toggling reference count REF_CNT has been determined as 5. Accordingly, either when the toggling input count IN_CNT of the write enable signal WE # is not a multiple of 5, that is, the toggling reference count REF_CNT, or when the toggling input cycle IN_DUTY of the write enable signal WE # is different from the toggling reference cycle REF_DUTY at least once, the memory device 10 may determine that an error has occurred in the write enable signal WE #.

Referring to FIG. 4B, the toggling input count IN_CNT of the write enable signal WE # is 4 and is not a multiple of the toggling reference count REF_CNT. Furthermore, some of the toggling input cycle IN_DUTY of the write enable signal WE # is longer than the toggling reference cycle REF_DUTY. Accordingly, the memory device 10 may determine that an error has occurred in the write enable signal WE #, and may perform a "defense operation" after performing a "set operation." For reference, a part that belongs to the write enable signal WE # and that has been illustrated as being toggled by a dotted line may mean the state in which the part has been lost without being toggled.

The memory device 10 may perform, as the "set operation", an operation of storing write data in the buffer region 60 in response to the data strobe signal DQS that is input along with the write enable signal WE # and that toggles by the toggling input count IN_CNT of the write enable signal WE #.

In FIG. 4B, the toggling input count IN_CNT of the write enable signal WE # is 4. Furthermore, the toggling count of the data strobe signal DQS is also 4. A total of eight "unit data" D<1:6, 9:10> are input to the memory device 10 as write data in a way that two "unit data" are input to the memory device 10, that is, in a way that one "unit datum" is input to the memory device 10 at each of a rising edge and falling edge of the data strobe signal DQS, in response to the data strobe signal DQS being toggled once. Accordingly, the memory device 10 may perform, as a "set operation", an operation of storing the total of eight "unit data" D<1:6, 9:10> in the buffer region 60 in response to the data strobe signal DQS being toggled four times in total. As described above, the target of the number of "unit data" to be stored in the memory region 20 of the memory device 10 through the write operation has been determined as a total of ten data D<1:10>, but a total number of "unit data" that is actually input to the memory device 10 may be eight D<1:6, 9:10> because of an error in the write enable signal WE #.

The memory device 10 may confirm that the toggling input count IN_CNT of the write enable signal WE # is 4 in the "set operation" interval, and may determine that an error has occurred in the write enable signal WE #. Since the toggling count of the write enable signal WE # is smaller than 5, that is, the targeted number as described above, only the eight "unit data" D<1:6, 9:10> may be stored in the buffer region 60 instead of the targeted 10 data D<1:10>. Accordingly, after completing the execution of the "set operation", the memory device 10 may discard the data D<1:6, 9:10> that are stored in the buffer region 60 by performing a "defense operation." When performing the "defense operation", the memory device 10 may output, to the memory controller 70, a signal indicating that the write operation has failed. Since the data D<1:6, 9:10> that are stored in the buffer region 60 has been discarded through the "defense operation" as described above, the memory device 10 may not perform an operation of programming, into the memory region 20, the data D<1:6, 9:10> that are stored in the buffer region 60. As described above, if an error occurs in the write enable signal WE # in the interval in which a "set operation" is executed, then the memory device 10 can prevent incomplete "unit data", that is, a number different from a targeted number of a write operation, from being programmed into the memory region 20 by performing a "defense operation."

Figure 5:
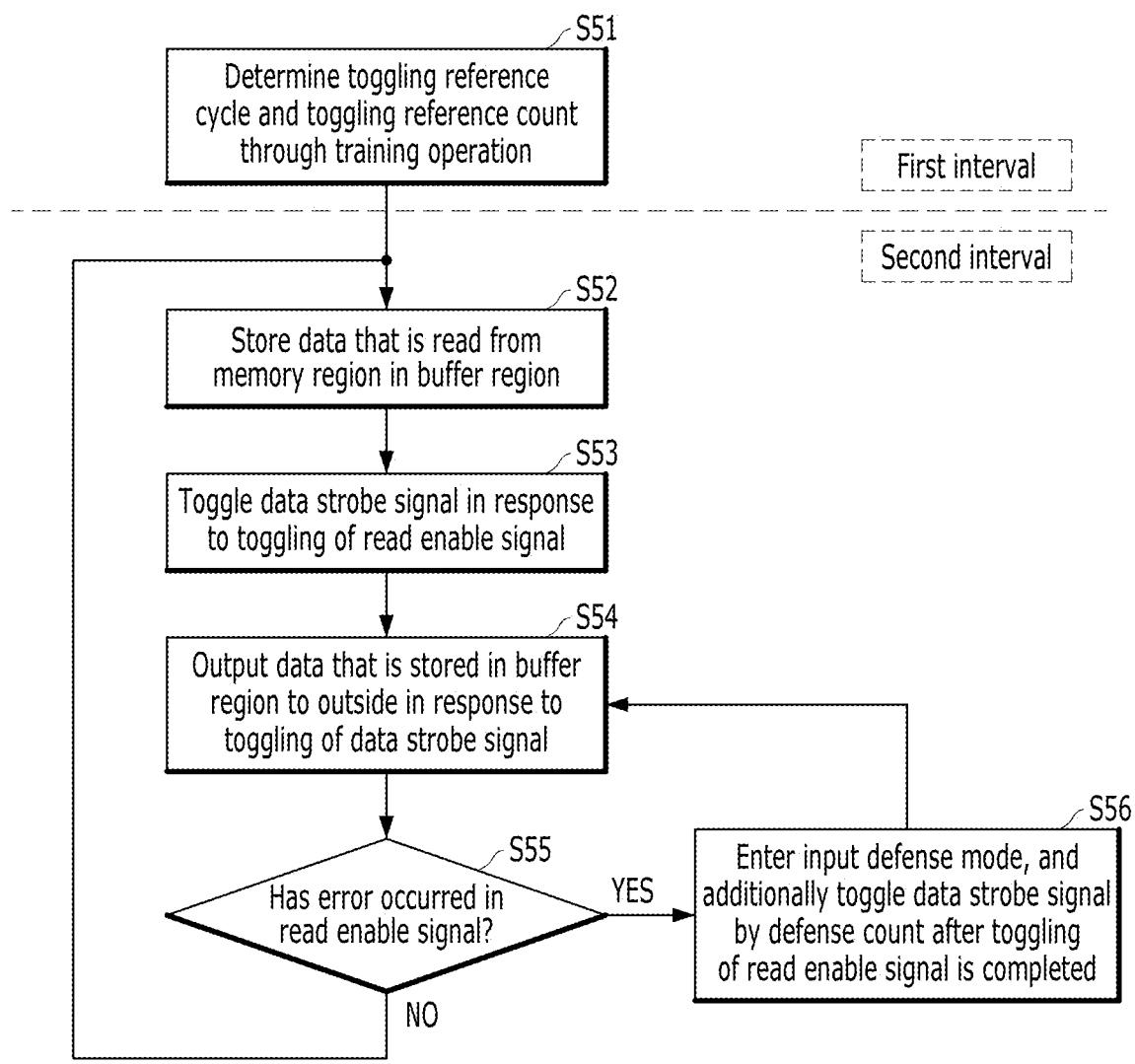
FIG. 5 is a flowchart for describing a data read operation of a memory device according to an embodiment of the present disclosure.

FIG. 5 is a flowchart for describing a data read operation of a memory device according to an embodiment of the present disclosure.

Referring to FIG. 5, a memory device may determine a toggling reference cycle and a toggling reference count through a training operation for a first interval that corresponds to any one of the interval in which the memory device is supplied with power and booted and the interval in which the memory device performs an initialization operation (S51).

The toggling reference cycle and the toggling reference count that have been determined in S51 may be stored in a given storage space within the memory device.

For a second interval that corresponds to the interval in which the memory device performs a read operation after the first interval, the memory device may read data from the memory region in response to a read command that is applied from the outside, and may store the read data in the buffer region (S52).

The memory device may toggle a data strobe signal in response to the toggling of a read enable signal that is applied from the outside after S52 in the second interval (S53).

The memory device may output, to the outside, the data that is stored in the buffer region in response to the toggling of the data strobe signal in S53 (S54).

The memory device may confirm whether an error has occurred in a read enable signal that is applied from the outside after S52 (S55). In S55, the memory device may determine whether an error has occurred in the read enable signal based on the toggling reference cycle and the toggling reference count that are stored in the given storage space within the memory device.

S55 may be an operation that is performed in response to the read enable signal that is applied from the outside after S52, and S53 and S54 are also operations that are performed in response to the read enable signal that is applied from the outside after S52. Accordingly, S55, S53, and S54 may be simultaneously performed.

If it is determined that an error has not occurred in the read enable signal in S55 (NO in S55), then the memory device may not enter the input defense mode, and may not perform a "defense operation" after the toggling of the read enable signal that is applied from the outside is completed. In such a case, in S54, the memory device may output, to the outside, all the data that are stored in the buffer region, in response to the data strobe signal that has been toggled in S53.

If it is determined that an error has occurred in the read enable signal in S55 (YES in S55), then the memory device may enter the input defense mode, and may perform a "defense operation" of additionally toggling the data strobe signal by a defense count after the toggling of the read enable signal that is applied from the outside is completed (S56). In such a case, in S54, the memory device may output the data that is stored in the buffer region, in response to the data strobe signal that is toggled in S53, and may then output the data that is stored in the buffer region, in response to the data strobe signal that is toggled in S56. Accordingly, the memory device may output, to the outside, all the data that are stored in the buffer region.

Figure 6:
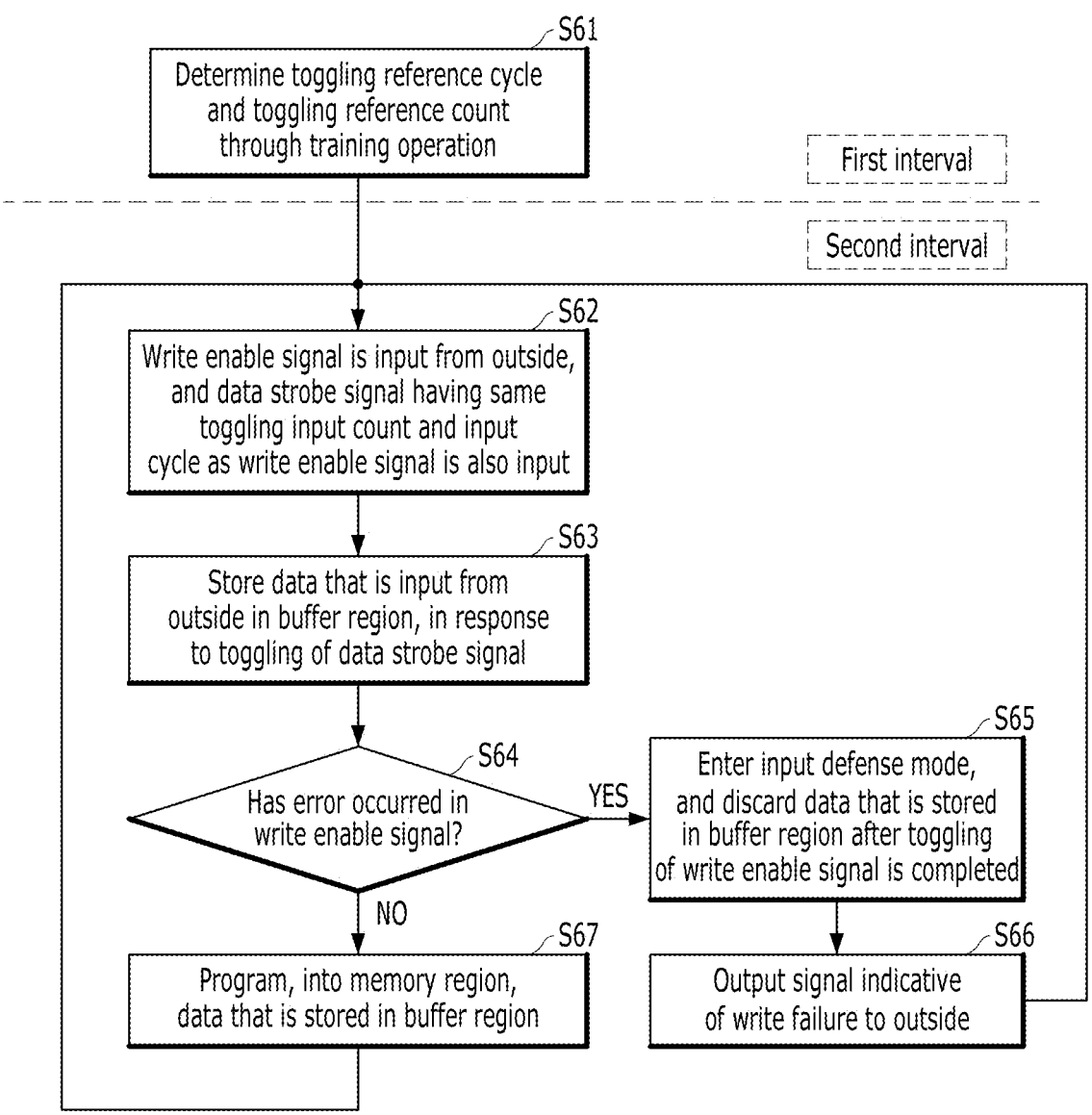
FIG. 6 is a flowchart for describing a data write operation of a memory device according to an embodiment of the present disclosure.

FIG. 6 is a flowchart for describing a data write operation of a memory device according to an embodiment of the present disclosure.

Referring to FIG. 6, a memory device may determine a toggling reference cycle and a toggling reference count through a training operation for a first interval corresponding to any one of the interval in which the memory device is supplied with power and booted and the interval in which the memory device performs an initialization operation (S61).

The toggling reference cycle and the toggling reference count that are determined in S61 may be stored in a given storage space within the memory device.

For a second interval that corresponds to the interval in which the memory device performs a write operation after the first interval, after a write command is input, a write enable signal may be input from the outside to the memory device. Accordingly, the data strobe signal having the same toggling input count and input cycle as the write enable signal may be input to the memory device (S62).

The memory device may store, in the buffer region, data that is input from the outside, in response to the toggling of the data strobe signal that is input from the outside in S62 (S63).

The memory device may confirm whether an error has occurred in the write enable signal that is input from the outside in S62 (S64). In S64, the memory device may determine whether an error has occurred in the write enable signal, based on the toggling reference cycle and the toggling reference count that are stored in the given storage space within the memory device.

S64 may be an operation that is performed in response to the write enable signal that is input from the outside in S62, and S63 is an operation that is performed in response to the data strobe signal that is input along with the write enable signal that is input from the outside in S62. Accordingly, S63 and S64 may be simultaneously performed.

If it is determined that an error has not occurred in the write enable signal in S64 (NO in S64), then the memory device may not enter the input defense mode, does not perform a "defense operation" after the toggling of the write enable signal that is applied from the outside is completed, and may program, into the memory region, the data that is stored in the buffer region (S67).

If it is determined that an error has occurred in the write enable signal in S64 (YES in S64), then the memory device may enter the input defense mode, and may perform an operation of discarding the data that is stored in the buffer region after the toggling of the write enable signal that is applied from the outside is completed (S65). Furthermore, after discarding the data that is stored in the buffer region in S65, the memory device may output a signal indicative of a write failure to the outside (S66). The memory device may perform a "defense operation" in the input defense mode through such S65 and S66.

The present disclosure described above is not limited to the aforementioned embodiments and the accompanying drawings. It is evident to a person having ordinary knowledge in the art to which the present disclosure pertains that the present disclosure may be substituted, modified, and changed in various ways without departing from the technical spirit of the present disclosure.

What is claimed is:

1. A memory device comprising:
a memory region configured to store data;
an operation control unit configured to determine a toggling reference cycle and a toggling reference count for a first interval, configured to determine whether an error has occurred in a toggling input cycle and input count of an external control signal that is applied from an outside, in order to control a data input/output operation for the memory region based on the toggling reference cycle and the toggling reference count for a second interval subsequent to the first interval, and configured to determine whether an input defense mode has been entered based on a result of the error determination; and
an operation execution unit configured to perform a set operation in response to the external control signal for the second interval and configured to perform, when the input defense mode has been entered, a defense operation that is predefined in the input defense mode in response to an output signal of the operation control unit.

2. The memory device of claim 1, wherein the operation control unit is configured to bring the operation execution unit into the input defense mode when the toggling input cycle is different from the toggling reference cycle at least once or when the toggling input count is not a multiple of the toggling reference count.

3. The memory device of claim 2, wherein when the external control signal is a read enable signal,
the operation execution unit is configured to perform an operation of outputting, to the outside, unit data that is read from the memory region to a buffer region and that is in a number corresponding to the toggling input count, by toggling a data strobe signal by the toggling input count through the set operation, and
the operation control unit is configured to control the operation execution unit to perform an operation of outputting, to the outside, the unit data that is read from the memory region to the buffer region and that is in a number corresponding to a defense count, by toggling the data strobe signal by the defense count through the defense operation.

4. The memory device of claim 3, wherein the operation control unit is configured to determine a value of the defense count so that a sum of the toggling input count and the defense count becomes a multiple of the toggling reference count.

5. The memory device of claim 3, wherein the operation execution unit comprises a toggle generation unit configured to toggle the data strobe signal having a first frequency by the toggling input count through the set operation, and configured to toggle the data strobe signal having a second frequency that is smaller than or equal to the first frequency by the defense count through the defense operation.

6. The memory device of claim 2, wherein when the external control signal is a write enable signal,
the operation execution unit is configured to perform an operation of storing, in a buffer region, unit data that is input from the outside and that is in a number corresponding to the toggling input count, in response to a data strobe signal that is input from the outside along with the write enable signal and that toggles by the toggling input count, through the set operation, and
the operation control unit is configured to control the operation execution unit to perform an operation of discarding data that is stored in the buffer region through the defense operation and to output a signal indicative of a write failure to the outside.

7. The memory device of claim 6, wherein the operation control unit is configured to program, into the memory region, the data that is stored in the buffer region after the set operation when the input defense mode is not entered.

8. The memory device of claim 1, wherein the operation control unit is configured to store, in a training storage region, a value of the toggling reference cycle that is determined by performing a training operation for the first interval and a value of the toggling reference count that is applied from the outside, and to then determine whether an error has occurred in the external control signal with reference to the training storage region for the second interval.

9. A memory system comprising:
a memory device configured to determine a toggling reference cycle and a toggling reference count for a first interval, configured to perform a set operation in response to a control signal that is applied from an outside for a second interval subsequent to the first interval, configured to determine, in an interval in which the set operation is performed, whether an error has occurred in a toggling input cycle and input count of the control signal based on the toggling reference cycle and the toggling reference count, and configured to determine whether to perform a defense operation after the execution of the set operation based on a result of the error determination; and
a memory controller configured to generate the control signal that toggles by an operation count, which is determined based on the toggling reference count, in an operating cycle that is determined based on the toggling reference cycle, and configured to output the generated control signal to the memory device, in order to input/output data between the memory controller and the memory device for the second interval.

10. The memory system of claim 9, wherein the memory controller is configured to determine a value of the toggling reference cycle by performing a training operation on the memory device in the first interval and to output, to the memory device, a value of the toggling reference count that is preset based on an operating environment.

11. The memory system of claim 10, wherein the memory device is configured to store, in a training storage region, a value of the toggling reference cycle that is determined by performing the training operation under a control of the memory controller and to store a value of the toggling reference count that is input by the memory controller for the first interval, and configured to determine whether an error has occurred in the control signal with reference to the training storage region for the second interval.

12. A memory device comprising:
a first storage region configured to store a determined toggling reference cycle and toggling reference count for a first interval;
a second storage region configured to store data;
a determination unit configured to determine whether an error has occurred in a toggling input cycle and input count of an external control signal that is applied from an outside in order to control a data input/output operation for the second storage region, based on the toggling reference cycle and the toggling reference count that are stored in the first storage region, for a second interval subsequent to the first interval;

a defense mode control unit configured to enter an input defense mode in order to control a preset defense operation based on a type of external control signal, in response to a determination of the determination unit indicating that an error has occurred in the external control signal at least once; and an operation execution unit configured to perform a set operation in response to the external control signal for the second interval and configured to then perform the defense operation when an input defense mode is entered in response to an output signal of the defense mode control unit.

13. The memory device of claim 12, wherein when the external control signal is a read enable signal, the set operation is an operation of outputting, to the outside, unit data that is read from the second storage region to a buffer region by a number corresponding to the input count by toggling a data strobe signal having a first frequency by the input count, and the defense operation is an operation of outputting, to the outside, unit data that is read from the second storage region to the buffer region by a number corresponding to a defense count that is determined by the defense mode control unit, by toggling the data strobe signal having a second frequency that is smaller than or equal to the first frequency by the defense count.

14. The memory device of claim 13, wherein the operation execution unit comprises a toggle generation unit configured to toggle the data strobe signal by the input count in response to the read enable signal, which is toggled by the input count, and configured to then toggle the data strobe signal by the defense count in response to a signal that is output by the defense mode control unit.

15. The memory device of claim 14, wherein:

the determination unit is configured to determine a value of the defense count required for the input count to become a multiple of the reference count, to generate a signal for delivering the determined value of the defense count, and to output the generated signal to the defense mode control unit, and the defense mode control unit is configured to generate a signal for toggling the data strobe signal by a defense count that is determined by the determination unit and to output the generated signal to the toggle generation unit.

16. The memory device of claim 12, wherein when the external control signal is a write enable signal, the set operation is an operation of storing, in a buffer region, unit data that is input from the outside by a number corresponding to the input count in response to a data strobe signal having the same toggling input cycle and input count as the write enable signal and applied from the outside, and the defense operation is an operation of discarding data that is stored in the buffer region and then outputting a signal indicative of a write failure to the outside.

17. The memory device of claim 16, wherein the operation execution unit comprises a buffer control unit configured to generate a signal for controlling an operation of the buffer region in response to a signal that is output by the defense mode control unit.

18. The memory device of claim 12, further comprising:

a training operation control unit configured to determine a value of the toggling reference cycle by performing a training operation for the first interval and configured to store, in the first storage region, a value of the toggling reference count that is applied from the outside;

a read operation unit configured to read data of the second storage region after a start of a read operation for the second interval and configured to store the read data in the buffer region; and a write operation unit configured to program, into the second storage region, the data that is stored in the buffer region after a start of a write operation for the second interval.

\* \* \* \* \*